United States Patent
Kanou et al.

(10) Patent No.: US 12,382,728 B2
(45) Date of Patent: Aug. 5, 2025

(54) PHOTOELECTRIC CONVERSION APPARATUS HAVING FILLER MEMBER AND AIRGAP ARRANGED IN INTERIOR OF TRENCH PORTION, PHOTOELECTRIC CONVERSION SYSTEM, AND MOVING BODY

(71) Applicant: CANON KABUSHIKI KAISHA, Tokyo (JP)

(72) Inventors: Taikan Kanou, Kanagawa (JP); Alice Ehara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 183 days.

(21) Appl. No.: 18/178,407

(22) Filed: Mar. 3, 2023

(65) Prior Publication Data
US 2023/0299221 A1    Sep. 21, 2023

(30) Foreign Application Priority Data

Mar. 15, 2022  (JP) .................. 2022-040248

(51) Int. Cl.
| | | |
|---|---|---|
| *H10F 19/40* | (2025.01) | |
| *H10F 19/10* | (2025.01) | |
| *H10F 19/90* | (2025.01) | |
| *H10F 71/00* | (2025.01) | |

(52) U.S. Cl.
CPC ............ *H10F 19/40* (2025.01); *H10F 19/10* (2025.01); *H10F 19/90* (2025.01); *H10F 71/00* (2025.01)

(58) Field of Classification Search
CPC ..... H01L 31/043; H01L 31/047; H01L 31/05; H01L 31/18
See application file for complete search history.

(56) References Cited

U.S. PATENT DOCUMENTS

| | | | |
|---|---|---|---|
| 2017/0047367 A1* | 2/2017 | Lee ................. | H01L 27/14621 |
| 2017/0047371 A1* | 2/2017 | Lee ................. | H01L 27/14643 |
| 2022/0171158 A1* | 6/2022 | Okumura ........... | G02B 26/0858 |

FOREIGN PATENT DOCUMENTS

| | | | | |
|---|---|---|---|---|
| JP | 2018093234 A | 6/2018 | | |
| WO | WO-2021149437 A1 * | 7/2021 | ............. | G01S 17/42 |

OTHER PUBLICATIONS

Hashiya et al., WO 2021149437 A1, English Machine Translation. (Year: 2021).*

* cited by examiner

*Primary Examiner* — Tae-Sik Kang
(74) *Attorney, Agent, or Firm* — Canon U.S.A., Inc. IP Division

(57) ABSTRACT

A photoelectric conversion apparatus includes a plurality of photoelectric conversion circuits configured to be arranged in a semiconductor layer having a first plane and a second plane. The plurality of photoelectric conversion circuits is individually isolated by an isolation structure. The semiconductor layer includes a plurality of trench portions arranged on the first plane of each of the photoelectric conversion circuits. The plurality of trench portions is configured of a first trench portion extending in a first direction as an in-plane direction of the first plane and a second trench portion extending in a second direction as an in-plane direction of the first plane intersecting with the first direction. A filler member and an airgap are arranged in an interior of a trench portion at a position where the first trench portion and the second trench portion intersect with each other.

14 Claims, 17 Drawing Sheets

PHOTOELECTRIC CONVERSION APPARATUS HAVING FILLER MEMBER AND AIRGAP ARRANGED IN INTERIOR OF TRENCH PORTION, PHOTOELECTRIC CONVERSION SYSTEM, AND MOVING BODY

BACKGROUND

Technical Field

One disclosed aspect of the embodiments relates to a photoelectric conversion apparatus and a photoelectric conversion system.

Description of the Related Art

There is provided a photoelectric conversion apparatus which improves quantum efficiency by increasing a light path length of light incident on a photoelectric conversion element by refracting the incident light through a concavo-convex structure arranged on a light receiving plane of the photoelectric conversion element.

However, in Japanese Patent Application Laid-Open No. 2018-093234, there is an issue in that considerable optical color mixture occurs because of limitation in an increase amount of the optical path length.

SUMMARY

One aspect of the embodiments is directed to a photoelectric conversion apparatus and a photoelectric conversion system capable of reducing the optical color mixture.

According to an aspect of the disclosure, a photoelectric conversion apparatus includes a plurality of photoelectric conversion circuits configured to be arranged in a semiconductor layer having a first plane and a second plane opposite to the first plane. The plurality of photoelectric conversion circuits is individually isolated by an isolation structure. The semiconductor layer includes a plurality of trench portions arranged on the first plane of each of the photoelectric conversion circuits demarcated by the isolation structure. The plurality of trench portions is configured of a first trench portion extending in a first direction as an in-plane direction of the first plane and a second trench portion extending in a second direction as an in-plane direction of the first plane intersecting with the first direction. A filler member and an airgap are arranged in an interior of a trench portion at a position where the first trench portion and the second trench portion intersect with each other.

Further features of the disclosure will become apparent from the following description of exemplary embodiments with reference to the attached drawings.

DESCRIPTION OF THE EMBODIMENTS

Figure 1:
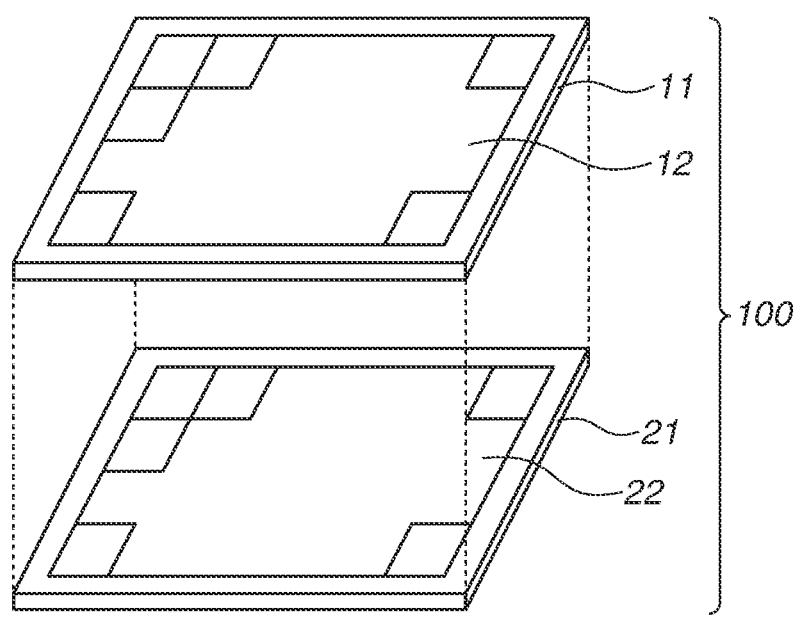
FIG. 1 is a schematic diagram illustrating a photoelectric conversion apparatus according to a present exemplary embodiment.

The embodiments described hereinafter are merely the examples embodying the technical sprit of the disclosure, and are not intended to limit the disclosure. In order to provide clear descriptions, in the drawings, sizes and a positional relationship of members may be illustrated with exaggeration. In the below-described exemplary embodiments, the same reference numerals are applied to constituent elements similar to each other, and descriptions thereof will be omitted. In the following, the term "unit" may refer to a software context, a hardware context, or a combination of software and hardware contexts. In the software context, the term "unit" refers to a functionality, an application, a software module, a function, a routine, a set of instructions, or a program that can be executed by a programmable processor such as a microprocessor, a central processing unit (CPU), or a specially designed programmable device or controller. A memory contains instructions or program that, when executed by the CPU, cause the CPU to perform operations corresponding to units or functions. In the hardware context, the term "unit" refers to a hardware element, a circuit, an assembly, a physical structure, a system, a module, or a subsystem. It may include mechanical, optical, or electrical components, or any combination of them. It may include active (e.g., transistors) or passive (e.g., capacitor) components. It may include semiconductor devices having a substrate and other layers of materials having various concentrations of conductivity. It may include a CPU or a programmable processor that can execute a program stored in a memory to perform specified functions. It may include logic elements (e.g., AND, OR) implemented by transistor circuits or any other switching circuits. In the combination of software and hardware contexts, the term "unit" or "circuit" refers to any combination of the software and hardware contexts as described above. In addition, the term "element," "assembly," "component," or "device" may also refer to "circuit" with or without integration with packaging materials. Furthermore, depending on the context, the term "portion," "part," "device," "switch," or similar terms may refer to a circuit or a group of circuits. The circuit or group of circuits may include electronic, mechanical, or optical elements such as capacitors, diodes, or transistors. For example, a switch is a circuit that turns on and turns off a connection. It can be implemented by a transistor circuit or similar electronic devices.

Hereinafter, exemplary embodiments of the disclosure will be described in detail with reference to the appended drawings. In the below-described exemplary embodiments, wordings (e.g., "up", "down", "right", and "left", and other wordings including these wordings) which express a particular direction and positions are used as necessary. These wordings are used for the sake of simplicity and easy understanding of the exemplary embodiments described with reference to the appended drawings, and meanings of these wordings should not be construed as limiting the technical range of the disclosure.

In this specification documents, a planar view refers to a view seen from a direction perpendicular to a light incident plane of a semiconductor layer. Further, a cross-sectional plane refers to a plane perpendicular to the light incident plane of the semiconductor layer. In a case where the light incident plane of the semiconductor layer has a rough surface in a microscopic view, the planar view is defined by taking the light incident plane of the semiconductor layer in a macroscopic view as a reference.

In the below-described exemplary embodiments, a potential of an anode of an avalanche photodiode (APD) is fixed, and a signal is taken from a cathode thereof. Accordingly, a first conductivity type semiconductor region, in which a majority carrier is an electric charge of a polarity the same as a polarity of a signal charge, refers to an N-type semiconductor region, and a second conductivity type semiconductor region, in which a majority carrier is an electric charge of a polarity different from the polarity of the signal charge, refers to a P-type semiconductor region.

In addition, the disclosure can also be realized in a case where a potential of a cathode of the APD is a fixed potential, and a signal is taken from an anode thereof. In this case, a first conductivity type semiconductor region, in which a majority carrier is an electric charge of a polarity the same as a polarity of a signal charge, refers to a P-type semiconductor region, and a second conductivity type semiconductor region, in which a majority carrier is an electric charge of a polarity different from the polarity of the signal charge, refers to an N-type semiconductor region. Although each of the exemplary embodiments will be described with respect to a case where a potential of one of the nodes of the APD is fixed, potentials of both nodes may be fluctuated.

In a case where a wording "impurity concentration" is simply used in this specification documents, this wording is used to mean a net impurity concentration obtained by subtracting impurities compensated by reverse conductivity-type impurities. In other words, "impurity concentration" indicates a net doping concentration. A semiconductor region where a P-type additive impurity concentration is higher than an N-type additive impurity concentration is a P-type semiconductor region. On the other hand, a semiconductor region where the N-type additive impurity concentration is higher than the P-type additive impurity concentration is an N-type semiconductor region.

A photoelectric conversion apparatus and a driving method thereof according to the disclosure, which are common to each of the exemplary embodiments, will be described with reference to FIG. 1 to FIGS. 5A to 5C.

FIG. 1 is a diagram illustrating a multilayer-type photoelectric conversion apparatus 100 according to the present exemplary embodiment.

The photoelectric conversion apparatus 100 is configured of two substrates, i.e., a sensor substrate 11 and a circuit substrate 21, which are stacked one on top of another and electrically connected to each other. The sensor substrate 11 includes a first semiconductor layer including photoelectric conversion elements 102 described below and a first wiring structure. The circuit substrate 21 includes a second semiconductor layer including a circuit of a signal processing unit 103 described below and a second wiring structure. The photoelectric conversion apparatus 100 is configured of the second semiconductor layer, the second wiring structure, the first wiring structure, and the first semiconductor stacked in that order. The photoelectric conversion apparatus 100 described in each of the exemplary embodiments is a back-face illumination type photoelectric conversion apparatus having a first plane on which light is incident and a second plane on which a circuit substrate is arranged.

Hereinafter, although the sensor substrate 11 and the circuit substrate 21 formed of diced chips are described, types of the substrates 11 and 21 are not limited to diced chips. For example, the respective substrates 11 and 21 may be formed of wafers. Further, the substrates 11 and 21 may be diced after being laminated in a state of wafers, or may be laminated and joined together after being formed into diced chips.

A pixel region 12 is arranged on the sensor substrate 11, and a circuit region 22 for processing a signal detected from the pixel region 12 is arranged on the circuit substrate 21.

Figure 2:
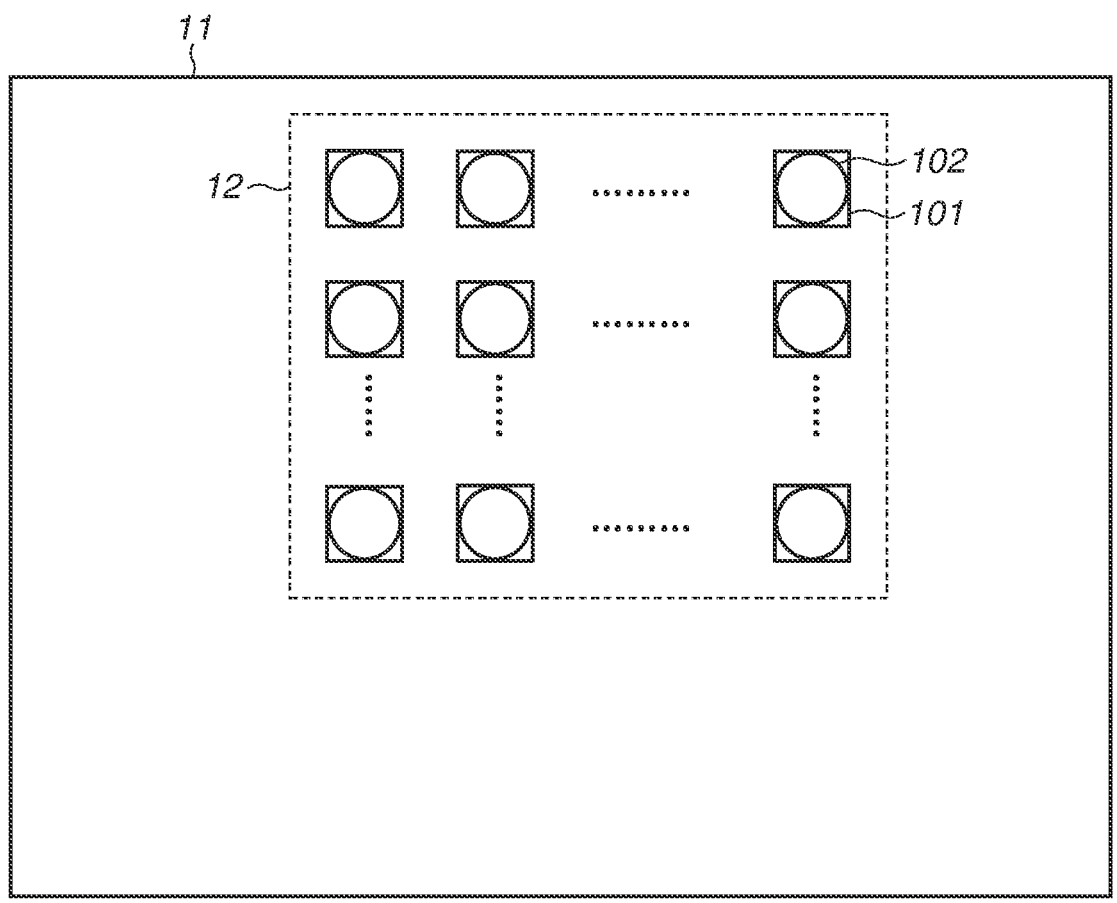
FIG. 2 is a schematic diagram illustrating a photodiode (PD) substrate of the photoelectric conversion apparatus according to the present exemplary embodiment.

FIG. 2 is a diagram illustrating an arrangement example of the sensor substrate 11. Pixels 101, each of which includes a photoelectric conversion element 102 including an APD, are arrayed in a two-dimensional array state in a planar view to form the pixel region 12.

Typically, the pixels 101 are pixels for forming an image. However, an image does not have to be formed thereby when the pixels 101 are used for a time-of-flight (TOF) system. In other words, the pixels 101 may be used for measuring an arrival time of light and an amount of light.

Figure 3:
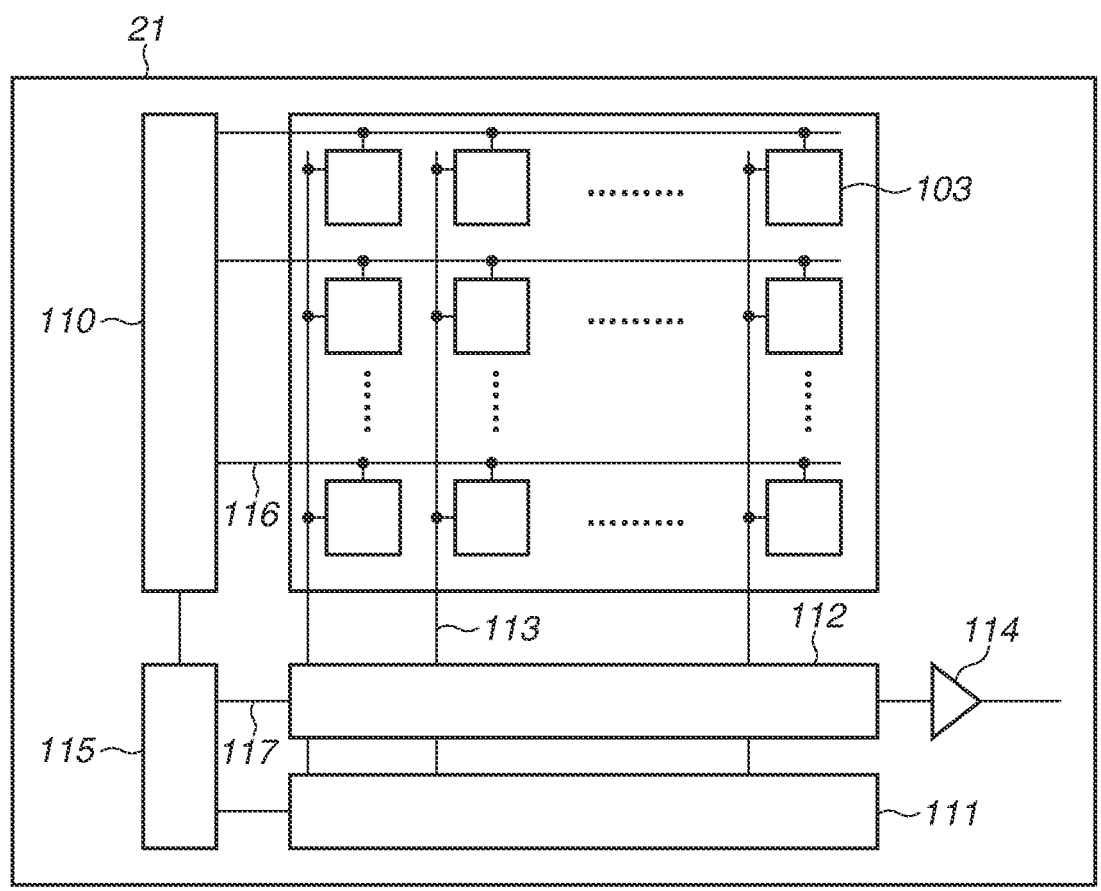
FIG. 3 is a schematic diagram illustrating a circuit substrate of the photoelectric conversion apparatus according to the present exemplary embodiment.

FIG. 3 is a diagram illustrating a structure of the circuit substrate 21. The circuit substrate 21 includes signal processing units or circuits 103 for processing electric charges photoelectrically converted by the photoelectric conversion elements 102 in FIG. 2, a column circuit 112, a control pulse generation unit or circuit 115, a horizontal scanning circuit unit 111, a signal line 113, and a vertical scanning circuit unit 110.

The photoelectric conversion elements 102 in FIG. 2 and the signal processing units 103 in FIG. 3 are electrically connected to each other via connection wiring arranged for each of the pixels 101.

The vertical scanning circuit unit 110 receives a control pulse supplied from the control pulse generation unit 115 and supplies the control pulse to each of the pixels 101. A logic circuit such as a shift register or an address decoder is used for the vertical scanning circuit unit 110.

Signals output from the photoelectric conversion elements 102 of the pixels 101 are processed by the signal processing units 103. Each of the signal processing units 103 includes a counter and a memory, and a digital value is stored in the memory.

In order to read out a digital signal stored in the memory of each of the pixels 101, the horizontal scanning circuit unit 111 outputs a control pulse for sequentially selecting each column to the signal processing unit 103.

A signal is output to the signal line 113 from the signal processing unit 103 of the pixel 101 selected by the vertical scanning circuit unit 110 in the selected column.

A signal output to the signal line 113 is output to a recording unit or circuit on the outside of the photoelectric conversion apparatus 100 via an output circuit 114, or output to the signal processing unit 103.

In FIG. 2, an array of the photoelectric conversion elements 102 may be arranged in a one-dimensional array state in the pixel region 12. Further, the effect of the present exemplary embodiment can also be acquired with respect to a case of a single pixel. Therefore, the disclosure also includes the case of a single pixel. A function of the signal processing unit 103 does not always have to be individually provided to all of the photoelectric conversion elements 102. Therefore, for example, one signal processing unit 103 may be shared by a plurality of photoelectric conversion elements 102, and the signal processing may be executed sequentially.

As illustrated in FIGS. 2 and 3, a plurality of signal processing units 103 is arranged in a region overlapping with the pixel region 12 in a planar view. Then, the vertical scanning circuit unit 110, the horizontal scanning circuit unit 111, the column circuit 112, the output circuit 114, and the control pulse generation unit 115 are arranged in a region which overlaps with a region between the edge of the sensor substrate 11 and the edge of the pixel region 12 in a planar view. In other words, The sensor substrate 11 includes the pixel region 12 and a non-pixel region arranged in the surroundings of the pixel region 12, and the vertical scanning circuit unit 110, the horizontal scanning circuit unit 111, the column circuit 112, the output circuit 114, and the control pulse generation unit 115 are arranged in the region overlapping with the non-pixel region in a planar view.

Figure 4:
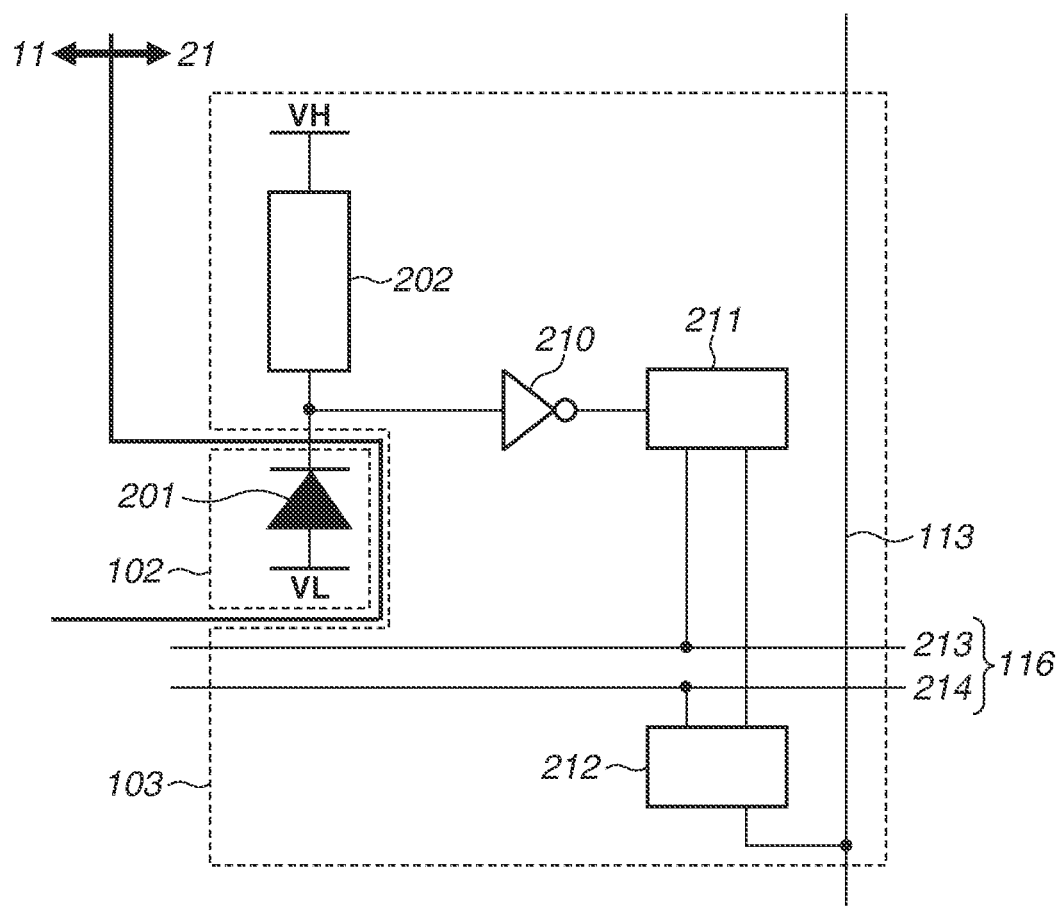
FIG. 4 is a diagram illustrating an example of a pixel circuit configuration of the photoelectric conversion apparatus according to the present exemplary embodiment.

FIG. 4 illustrates an example of a block diagram including an equivalent circuit in FIGS. 2 and 3.

In FIG. 2, the photoelectric conversion elements 102 including the APDs 201 are arranged on the sensor substrate 11, and the other members are arranged on the circuit substrate 21.

Each of the APDs 201 is a photoelectric conversion unit which executes photoelectric conversion to generate an electric charge pair depending on incident light.

A voltage VL (first voltage) is supplied to an anode of the APD 201. A voltage VH (second voltage) higher than the voltage VL supplied to the anode is supplied to a cathode of the APD 201. A reverse bias voltage which causes the APD 201 to perform avalanche multiplication is supplied to the anode and the cathode. In a state where the above-described voltage is supplied thereto, avalanche multiplication occurs in the electric charge generated from incident light, so that avalanche current is generated.

In addition, in a case where reverse bias voltage is supplied thereto, the APD 201 can be operated in the Geiger mode or a linear mode. In the Geiger mode, the APD 201 is operated in a state where a difference in electric potentials of the anode and the cathode is greater than a breakdown voltage. In the linear mode, the APD 201 is operated in a state where a difference in electric potentials of the anode and the cathode is close to the breakdown voltage, or equal to or less than the breakdown voltage.

An APD operated in the Geiger mode is called a single-photon avalanche diode (SPAD). For example, the voltage VL (first voltage) of −30V and the voltage VH (second voltage) of 1V are supplied thereto. The APD 201 can be operated in either the linear mode or the Geiger mode. However, it is preferable that the APD 201 be operated as the SPAD because an electric potential difference is greater than that of the APD 201 operated in the linear mode, so that a notable effect can be acquired with respect to the withstand voltage.

A quench element 202 is connected to a power source for supplying the voltage VH and the APD 201. When signal multiplication occurs because of avalanche multiplication, the quench element 202 functions as a load circuit (quench circuit) to suppress avalanche multiplication by suppressing voltage supplied to the APD 201 (i.e., quench operation). Further, the quench element 202 functions to bring back the voltage supplied to the APD 201 to the voltage VH by applying electric current corresponding to the voltage dropped by the quench operation (i.e., recharge operation).

The signal processing unit 103 includes a waveform shaping unit or circuit 210, a counter circuit 211, and a selection circuit 212. In this specification documents, the signal processing unit 103 may include any one of the waveform shaping unit 210, the counter circuit 211, and the selection circuit 212.

The waveform shaping unit 210 shapes a potential change of the cathode of the APD 201 acquired at the time of photon detection into a pulse signal and outputs the pulse signal. For example, an inverter circuit is used as the waveform shaping unit 210. In FIG. 4, an example of the configuration using one inverter as the waveform shaping unit 210 is illustrated. However, a circuit including a plurality of inverter connected in series or another circuit having a waveform shaping effect can also be used.

The counter circuit 211 counts a pulse signal output from the waveform shaping unit 210 and retains a count value. When a control pulse pRES is supplied thereto via a drive wire 213, a signal retained in the counter circuit 211 is reset.

A control pulse pSEL is supplied to the selection circuit 212 from the vertical scanning circuit unit 110 in FIG. 3 via a drive wire 214 in FIG. 4 (not illustrated in FIG. 3), so that the electrical connection between the counter circuit 211 and the signal line 113 is switched on and off. For example, the selection circuit 212 includes a buffer circuit for outputting a signal.

The electrical connection can be switched by arranging a switch such as a transistor between the quench element 202 and the APD 201 or the photoelectric conversion element 102 and the signal processing unit 103. Similarly, the voltage VH or VL supplied to the photoelectric conversion element 102 can also be switched electrically by using a switch such as a transistor.

In the present exemplary embodiment, a configuration using the counter circuit 211 is described. However, the photoelectric conversion apparatus 100 may acquire a pulse detection timing by using a time-to-digital converter (TDC) and a memory instead of using the counter circuit 211. At this time, a generation timing of the pulse signal output from the waveform shaping unit 210 is converted to a digital signal through the TDC. In order to measure a timing of the pulse signal, a control pulse pREF (reference signal) is supplied to the TDC from the vertical scanning circuit unit 110 in FIG. 1 via a drive wire. By making the control pulse pREF as a reference, the TDC takes an input timing of a signal output from each of the pixels 101 as a relative time and acquires a signal of that time as a digital signal via the waveform shaping unit 210.

Figure 5A:
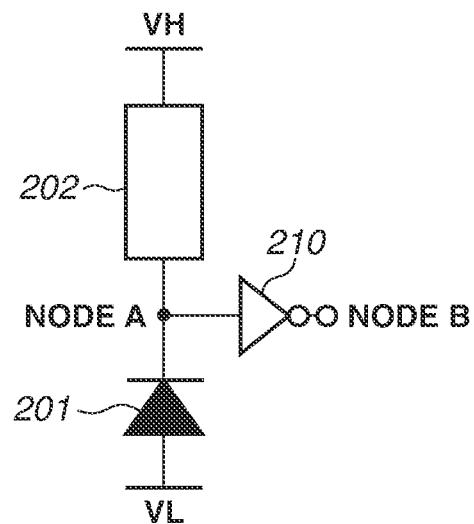
FIGS. 5A to 5C are diagrams schematically illustrating a driving configuration of the pixel circuit of the photoelectric conversion apparatus according to the present exemplary embodiment.
Figure 5B:
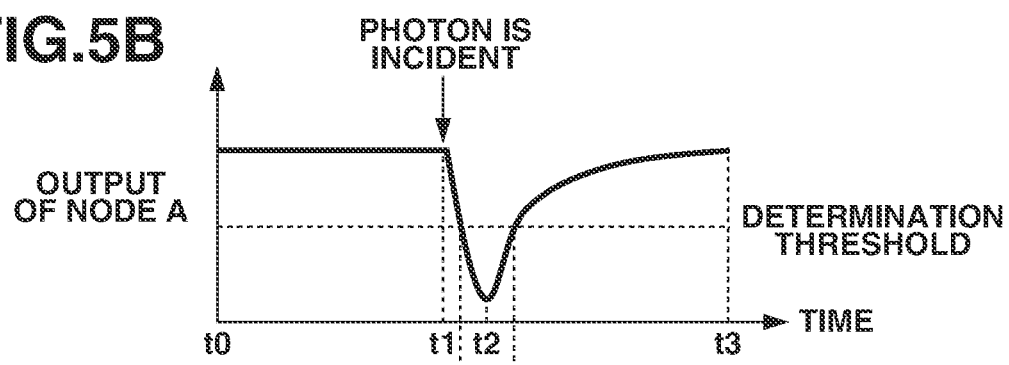
Figure 5C:
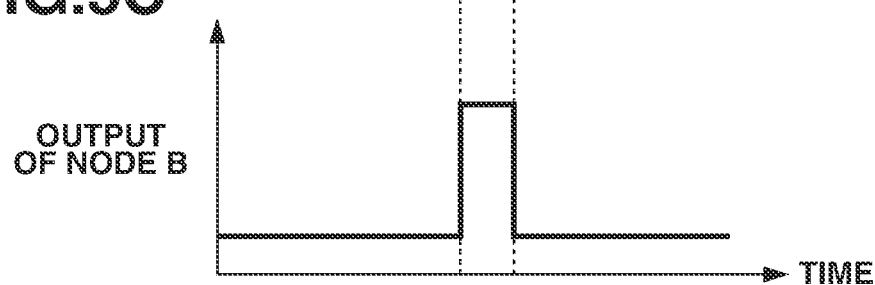

FIGS. 5A to 5C are diagrams schematically illustrating a relationship between the operation of the APD 201 and the output signal.

FIG. 5A illustrates the APD 201, the quench element 202, and the waveform shaping unit 210 extracted from FIG. 4. Herein, an input side and an output side of the waveform shaping unit 210 are called "node A" and "node B", respectively. A change of waveform at the node A in FIG. 5A is illustrated in FIG. 5B, and a change of waveform at the node B in FIG. 5A is illustrated in FIG. 5C.

In a period between time t0 to time t1, a potential difference of VH-VL is applied to the APD 201 in FIG. 5A. When photons are incident on the APD 201 at the time t1, avalanche multiplication occurs in the APD 201, and an avalanche multiplication current flows in the quench element 202, so that a voltage of the node A is dropped. When the amount of voltage drop is further increased, and a difference in electric potentials applied to the APD 201 is reduced, the avalanche multiplication occurring in the APD 201 is stopped at time t2, so that a voltage of the node A will not be dropped to lower than a certain level. After that, in a period between the time t2 and the time t3, electric current for compensating the amount of dropped voltage flows into the node A from the voltage VL, so that the electric potential at the node A is settled in the original potential level at time t3. At this time, the output waveform which exceeds a certain threshold at the node A is shaped by the waveform shaping unit 210 and is output as a signal at the node B.

In addition, the arrangement of the signal line 113, the column circuit 112, and the output circuit 114 is not limited to the arrangement illustrated in FIG. 3. For example, the signal line 113 may extend in a row direction, and the column circuit 112 may be arranged at a position where the signal line 113 extends.

The photoelectric conversion apparatus 100 according to each of the exemplary embodiments will be described below.

A photoelectric conversion apparatus 100 according to a first exemplary embodiment will be described with reference to FIGS. 6 to 12.

Figure 6:
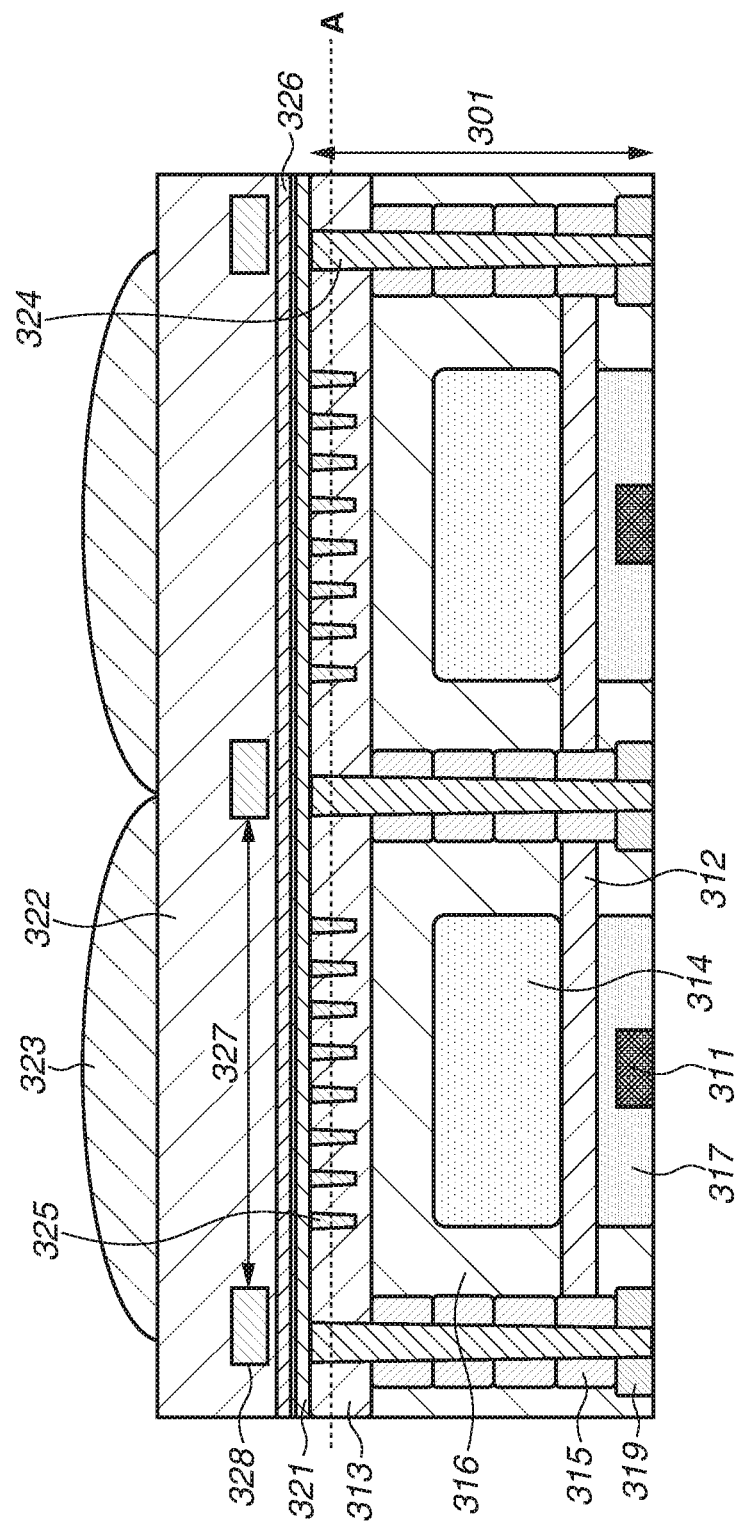
FIG. 6 is a cross-sectional diagram illustrating a pixel of the photoelectric conversion apparatus according to a first exemplary embodiment.

FIG. 6 is a diagram illustrating a cross-sectional view of two pixels 101 of photoelectric conversion elements 102 included in the photoelectric conversion apparatus 100 according to the disclosure, viewed from a direction perpendicular to a plane direction of the substrate.

A structure of the photoelectric conversion element 102 will be described. The photoelectric conversion element 102 includes an N-type first semiconductor region 311, an N-type fourth semiconductor region 314, an N-type sixth semiconductor region 316, and an N-type seventh semiconductor region 317. The photoelectric conversion element 102 further includes a P-type second semiconductor region 312, a P-type third semiconductor region 313, a P-type fifth semiconductor region 315, and a P-type eighth semiconductor region 318.

In the present exemplary embodiment, as illustrated in the cross-sectional view in FIG. 6, the N-type first semiconductor region 311 is formed in a vicinity of a plane opposite to a light incident plane, and the N-type seventh semiconductor region 317 is formed in a periphery of the first semiconductor region 311. The P-type second semiconductor region 312 is formed at a position overlapping with the first semiconductor region 311 and the seventh semiconductor region 317 in a planar view. Further, the N-type fourth semiconductor region 314 is arranged at a position overlapping with the second semiconductor region 312 in the planar view, and the N-type sixth semiconductor region 316 is formed in a periphery of the fourth semiconductor region 314.

The N-type impurity concentration is higher in the first semiconductor region 311 than in the fourth semiconductor region 314 or the seventh semiconductor region 317. A P-N junction is formed in a region between the P-type second semiconductor region 312 and the N-type first semiconductor region 311. However, by making the impurity concentration in the second semiconductor region 312 be lower than in the first semiconductor region 311, all of the second semiconductor region 312 becomes a depletion layer region. This depletion layer region further extends to part of the first semiconductor region 311, and an intense electric field is induced in this extended depletion layer region. This intense electric field causes the avalanche multiplication to occur in the depletion layer region extending to the part of the first semiconductor region 311, and the electric current based on the amplified electric charge is output as a signal charge. When light incident on the photoelectric conversion element 102 is photoelectrically converted, and avalanche multiplication occurs in the depletion layer region (i.e., avalanche multiplication region), the generated first conductive type electric charges are collected in the first semiconductor region 311.

In addition, in FIG. 6, although sizes of the fourth semiconductor region 314 and the seventh semiconductor region 317 are approximately the same, sizes of the semiconductor regions 314 and 317 are not limited thereto. For example, the fourth semiconductor region 314 may be formed into a size larger than a size of the seventh semiconductor region 317, so that the electric charges can be collected in the first semiconductor region 311 from a wider range.

A concavo-convex structure 325 configured of trench portions is formed on a surface of a semiconductor layer 301 on a side of a light incident plane. The concavo-convex structure 325 is surrounded by the P-type third semiconductor region 313, and makes light incident on the photoelectric conversion element 102 scatter. Because the incident light obliquely travels through the photoelectric conversion element 102, a light path length greater than a thickness of the semiconductor layer 301 can be secured. Therefore, light having a longer wavelength can be photoelectrically converted in comparison to the case where the concavo-convex structure 325 is not formed thereon. Furthermore, because the concavo-convex structure 325 can prevent incident light from being reflected within the substrate, an effect of improving the photoelectric conversion rate of incident light can be acquired.

The fourth semiconductor region 314 is formed to overlap with the concavo-convex structure 325 in the planar view. The area where the fourth semiconductor region 314 overlaps with the concavo-convex structure 325 in the planar view is greater than the area where the fourth semiconductor region 314 does not overlap with the concavo-convex structure 325. In comparison to the electric charges generated in a region close to the avalanche multiplication region, the electric charges generated in a region far from the avalanche multiplication region between the first semiconductor region 311 and the fourth semiconductor region 314 require longer travel time to reach the avalanche multiplication region. Therefore, there is a possibility that timing jitter thereof is worsened. By arranging the fourth semiconductor region 314 and the concavo-convex structure 325 at positions overlapping with each other in the planar view, an electric field in a deep portion of the photodiode can be enhanced, and time taken to collect the electric charges generated in a region far from the avalanche multiplication region can be shortened. Therefore, it is possible to reduce the timing jitter.

Further, by covering the concavo-convex structure 325 with the third semiconductor region 313 three-dimensionally, it is possible to suppress generation of thermally excited electric charges at an interfacial surface of the concavo-convex structure 325. Through the above-described configuration, a dark count rate (DCR) of the photoelectric conversion element 102 can be suppressed.

One pixel 101 is isolated from another pixel 101 by a pixel isolation part 324 having a trench structure, and the P-type fifth semiconductor region 315 formed in the periphery thereof isolates one photoelectric conversion element 102 from another photoelectric conversion element 102 adjacent thereto with a potential barrier. Because the photoelectric conversion elements 102 are isolated from one another by the potential of the fifth semiconductor region 315, demarcation provided by a pixel isolation structure such as the pixel isolation part 324 having a trench structure is not essential. Further, when the pixel isolation part 324 is to be arranged, a depth and a position thereof are not limited to the configuration illustrated in FIG. 6. The pixel isolation part 324 may be a deep trench isolation (DTI) which penetrates through the semiconductor layer 301, or may be a DTI which does not penetrate the semiconductor layer 301. Furthermore, a metal may be embedded in the DTI for the sake of improving the light-shielding capability. The pixel isolation part 324 may be arranged to surround the entire circumference of the photoelectric conversion element 102 in the planar view, or may be arranged on only side portions of the photoelectric conversion element 102 opposite to each other.

A distance from a pixel isolation part 324 to one pixel 101 adjacent thereto, or a distance from one pixel isolation part 324 to another pixel isolation part 324 of a pixel 101 arranged at a closest position, can be regarded as a size of one photoelectric conversion element 102. When a size of one photoelectric conversion element 102 is L, a distance d from the light incident plane to the avalanche multiplication region satisfies a relational expression $L\sqrt{2}/4 < d < L \times \sqrt{2}$. In a case where a size and a depth of the photoelectric conversion element 102 satisfy the above relational expression, the intensity of the electric field in a depth direction and the intensity of the electric field in an in-plane direction are substantially the same in a vicinity of the first semiconductor region 311. Occurrence of timing jitter can be reduced because variation in time required for electric charge collection can be suppressed.

Further, a pinning film 321, an interlayer film 322, and a micro-lens 323 are formed on a side of the light incident plane of the semiconductor layer 301. A filter layer (not illustrated) may also be arranged on the light incident plane side thereof. Various types of optical filters, e.g., a color filter, an infrared cut filter, and a black-and-white filter, can be used for the filter layer. A red-green-blur (RGB) color filter or a red-green-blue-white (RGBW) color filter can be used as the color filter.

Further, the photoelectric conversion apparatus 100 according to the present exemplary embodiment includes an antireflection film 326 and a light-shielding part 328 having an opening 327 arranged in a region between the semiconductor layer 301 and the interlayer film 322.

A refractive index of the antireflection film 326 is lower than an effective refractive index of the concavo-convex structure 325. Herein, the effective refractive index refers to a substantial refractive index of the entire concavo-convex structure 325 configured of a base in which the trenches are formed and members embedded in the trenches. For example, in a case where the semiconductor layer 301 consists of silicon (Si) having a refractive index of 4, and the interlayer film 322 consists of silicon monoxide (SiO) having a refractive index of 1.5, the effective refractive index of the concavo-convex structure 325 is 2.8 to 3.8. For example, the antireflection film 326 consists of tantalum pentoxide ($Ta_2O_5$) having a refractive index of around 2. By arranging the antireflection film 326 in a region between the semiconductor layer 301 and the interlayer film 322, the refractive index is changed moderately in the region from the semiconductor layer 301 to the interlayer film 322. With this configuration, light of avalanche light emission is prevented from being reflected on a rear surface of the semiconductor layer 301, and occurrence of crosstalk caused by the light of avalanche light emission can be reduced.

The opening 327 is arranged to enclose the first semiconductor region 311 in a planar view viewed from a direction perpendicular to the light incident plane. By arranging the light-shielding part 328 between the pixels 101, occurrence of crosstalk caused when the light of avalanche light emission generated in one pixel 101 travels to the outside of the one pixel 101 and enters another pixel 101 adjacent thereto can be reduced.

With this configuration, a light path length greater than the thickness of the semiconductor layer 301 can be secured by making incident light scatter within the pixel 101, so that photoelectric conversion of light having a longer wavelength can be executed, and light of avalanche light emission described below can be efficiently released to the outside of the semiconductor layer 301.

Figure 7:
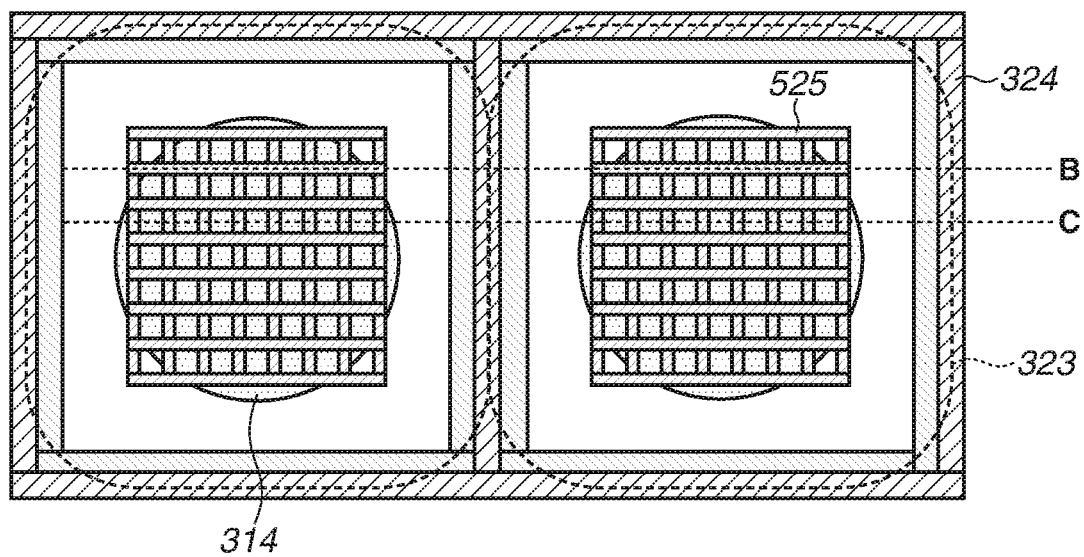
FIG. 7 is a diagram illustrating a plan view of the pixel of the photoelectric conversion apparatus according to the first exemplary embodiment.

FIG. 7 is a diagram illustrating a top plan view of the two pixels 101 included in the photoelectric conversion apparatus 100 according to the present exemplary embodiment, taken along a dashed line A in FIG. 6. The concavo-convex structure 325 is arranged on each of the pixels 101 demarcated by the pixel isolation part 324. The micro-lens 323 is arranged along the pixel isolation part 324, and the concavo-convex structure 325 and the fourth semiconductor region 314 are arranged to overlap with each other.

Figure 8:
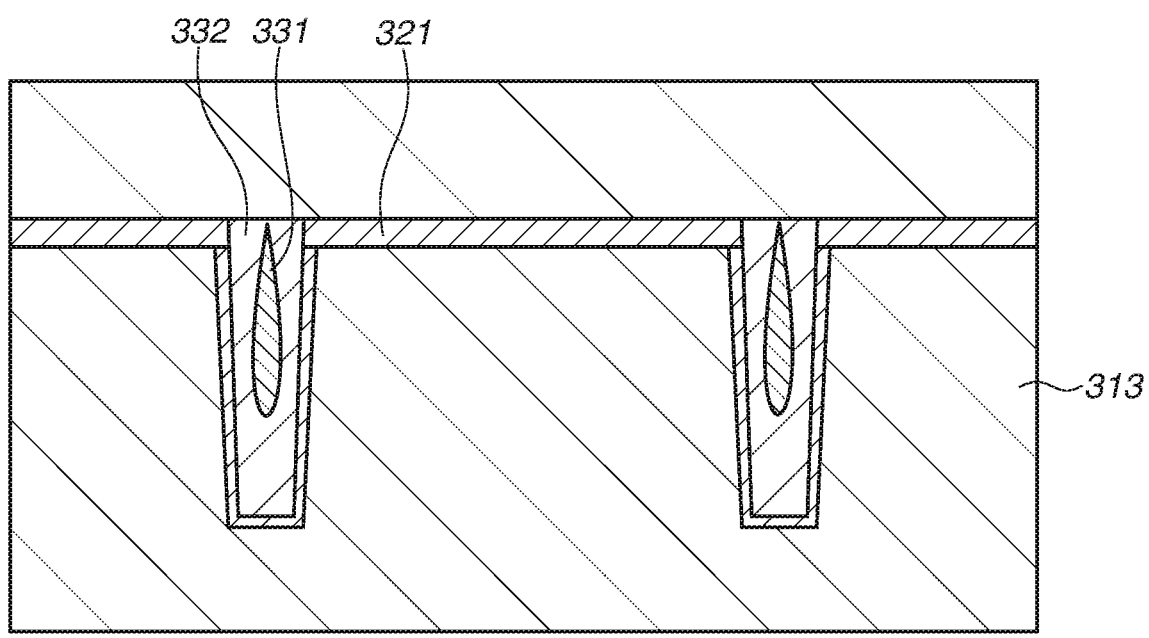
FIG. 8 is a schematic diagram of the photoelectric conversion apparatus according to the first exemplary embodiment.

FIG. 8 is an enlarged cross-sectional view taken along a dashed line B in FIG. 7, which illustrates two trench structures arranged in a region where a first trench portion intersects with a second trench portion. The first trench portion refers to a trench portion extending in a first direction as an in-plane direction of the light incident plane (first plane), and the second trench portion refers to a trench portion extending in a second direction intersecting with the first direction, from among the trench portions for constituting the concavo-convex structure 325. Hereinafter, a portion of one trench portion extending in the first or the second direction, where the one trench portion does not intersect with another trench portion, is called a line portion, and a portion where the one trench portion intersects with another trench portion is called a cross portion.

The trench structure which forms the trench portions contains a material different from the material of the third semiconductor region 313. For example, in a case where the third semiconductor region 313 contains silicon, a member which mainly constitutes the trench structure is a silicon oxide film or a silicon nitride film, although the trench structure may include a metallic material or an organic material.

For example, a trench portion is formed with a depth of 0.1 µm to 0.6 µm from the surface of the semiconductor layer 301. In order to sufficiently increase a degree of diffraction of incident light, it is preferable that a depth of the trench portion be greater than a width thereof. Herein, a width of the trench portion is a width from an interfacial surface between the pinning film 321 and the third semiconductor region 313 and an interfacial surface between the pinning film 321 and the third semiconductor region 313 on a plane passing through a gravity center portion of a cross-sectional plane of the trench portion, and a depth of the trench portion is a depth from the light incident plane to a bottom of the trench portion.

The trench portions which constitute the concavo-convex structure 325 in FIG. 8 are filled with filler members 332. For example, a silicon oxide film or a silicon nitride film is used as the filler member 332 when the third semiconductor region 313 contains silicon. However, a metallic material or an organic material may also be used as the filler member 332. Airgaps 331 are formed in the interior of the filler member 332 in order to increase a degree of change of refractive index at the concavo-convex structure 325. The filler member 332 fills up the trench portions of the concavo-convex structure 325 and covers the pinning film 321 arranged in the interior of the trench portions.

Herein, each of the airgaps 331 is formed and located at a depth two-thirds the depth of the trench portion of the concavo-convex structure 325 from the upper edge of the pinning film 321, so that the airgap 331 does not make contact with the bottom of the trench structure. If the airgap 331 reaches the bottom of the trench portion, a refractive index remains unchanged between the airgap 331 and the filler member 332, and reflection at the bottom of the trench portion is increased to cause lowering of sensitivity. Therefore, the airgap 331 is formed in the above-described state in order to prevent lowering of sensitivity. In the example illustrated in FIG. 8, the upper end portion of the airgap 331 conforms to the surface of the pinning film 321.

Figure 9:
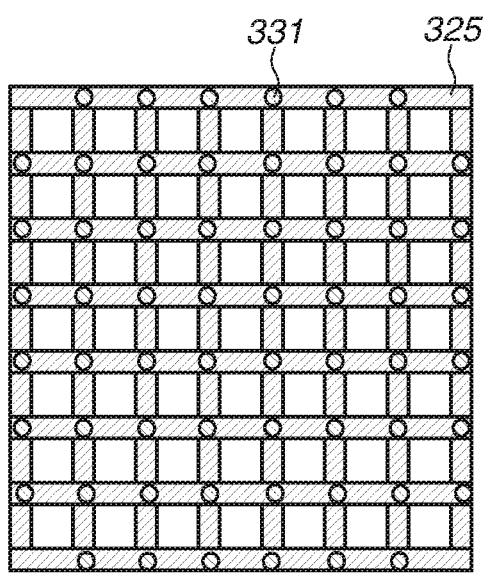
FIG. 9 is a schematic diagram of the photoelectric conversion apparatus according to the first exemplary embodiment.

FIG. 9 is a top plan view of the concavo-convex structure 325, which illustrates positions where the airgaps 331 are generated in the concavo-convex structure 325. In a case where the concavo-convex structure 325 is arranged in a grid-like state as illustrated in FIG. 7, the airgaps 331 are generated at intersection points (cross portions) of the trench portions which form the concavo-convex structure 325.

Hereinafter, a forming method of the trench portion will be described. First, a trench portion is formed in the third semiconductor region 313 of the semiconductor layer 301 by etching.

Thereafter, a pinning film 321 is formed on a surface of the third semiconductor region 313 and in an interior of the trench portion through a method such as a chemical vapor deposition (CVD) method.

The filler member 332 is further embedded in the interior of the trench portion covered by the pinning film 321. For example, the filler member 332 is embedded therein through a chemical vapor deposition (CVD) method. A CVD method such as a thermal CVD method, a plasma-enhanced CVD method, or a low-pressure CVD method can be used. Further, the interior can be filled through a method such as a sol-gel method. At this time, by optimizing a film deposition condition of the CVD, a film deposition speed in a corner part can be increased and faster than in a flat part. By closing the corner part earlier than the flat part, the airgap 331 is formed in the interior of the trench portion.

In the concavo-convex structure 325 configured of trench portions arranged in a grid-like state, in a case where a line width of a line portion is fixed, and the line portion orthogonally intersects with another line portion at a cross portion, a line width of the cross portion in a diagonal direction is $\sqrt{2}$ times as large as a line width of the line portion in an opposite side direction. Therefore, when a trench portion is filled with the filler member 332, an interior of the line portion is closed before an interior of the cross portion is closed. Although a corner part of the line portion is closed earlier than a flat part thereof, the entire line portion is filled with the filler member 332 before the cross portion is closed because gas is supplied from an unclosed part of the cross portion. Therefore, a large airgap 331 formed in the cross portion is not formed in the line portion.

In a case where the airgap 331 is uniformly and continuously formed in the entire trench portions of the concavo-convex structure 325, incident light is considerably diffracted in a specific direction because of symmetry of a refractive index change of the airgap 331. Therefore, an increase amount of the optical path length is limited, so that considerable optical color mixture is likely to occur in the adjacent pixels 101. As illustrated in FIG. 9, in a case where airgaps 331 are formed only in the intersection points of the trench portions of the concavo-convex structure 325, the light path length can be increased because incident light is also diffracted in an oblique direction considerably. With this configuration, an effect of improving the sensitivity to near-infrared light can be increased. An effect of reducing the optical color mixture can also be acquired because an angle of light incident on adjacent pixels 101 becomes greater.

In addition, the trench portions which form the concavo-convex structure 325 and the trench portions which form the pixel isolation part 324 can be filled in the same processing. In this case, side walls of the trench portions for forming the concavo-convex structure 325 and side walls of the trench portions for forming the pixel isolation part 324 have equivalent impurity concentrations. Hereinafter, a difference between structures of the trench portions for forming the concavo-convex structure 325 and the trench portions for forming the pixel isolation part 324 will be described.

Figure 10A:
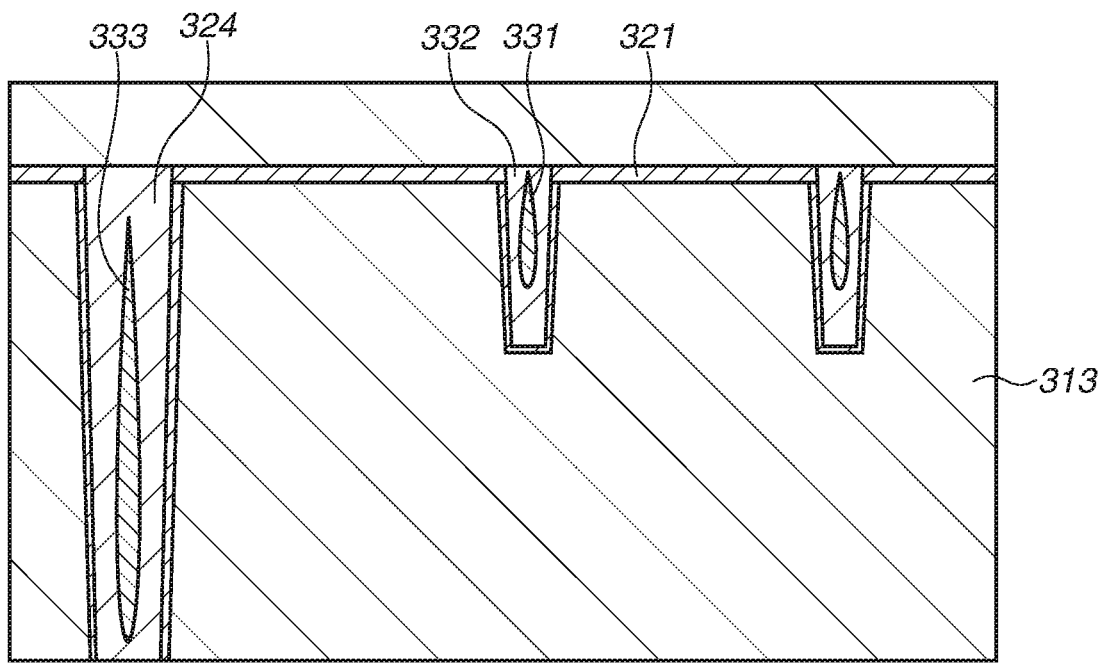
FIGS. 10A and 10B are schematic diagrams of the photoelectric conversion apparatus according to the first exemplary embodiment.
Figure 10B:
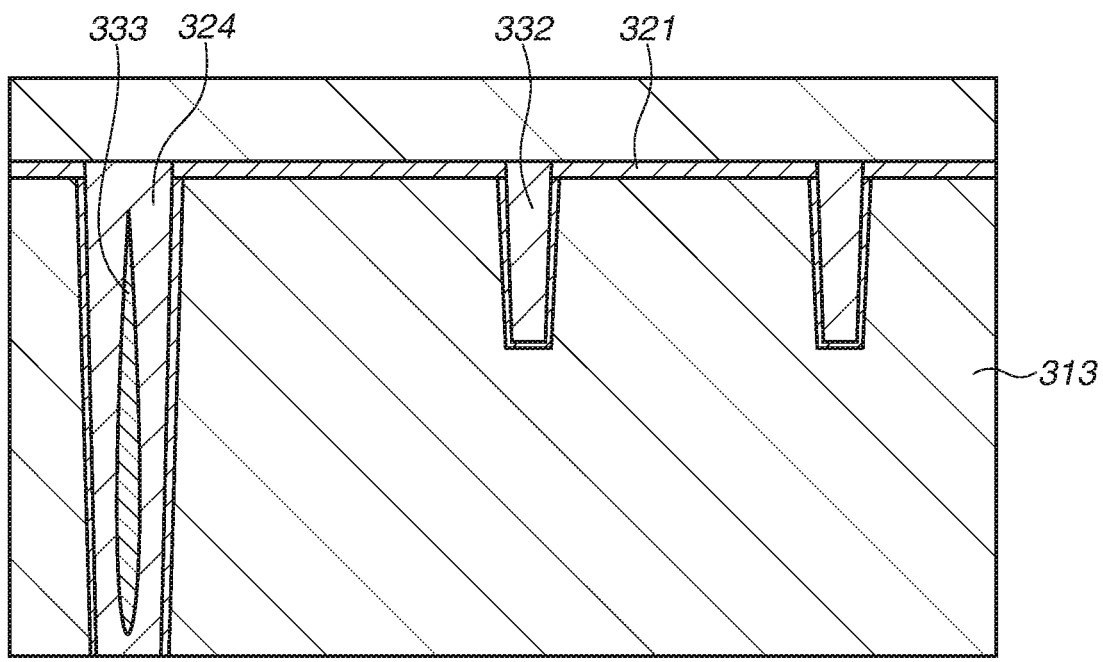

FIG. 10A is a diagram illustrating an enlarged cross-sectional view of the concavo-convex structure 325 and the pixel isolation part 324 taken along a dashed line B in FIG. 7. FIG. 10B is a diagram illustrating an enlarged cross-sectional view of the concavo-convex structure 325 and the pixel isolation part 324 taken along a dashed line C in FIG. 7.

The pixel isolation part 324 is a trench structure of a depth penetrating through the third semiconductor region 313, and the pixel isolation part 324 and the concavo-convex structure 325 are filled with the same filler member 332 simultaneously. As described above, the filler member 332 may be a silicon oxide film or a silicon nitride film, or may be a metallic material or an organic material. It is possible to simplify the processing by filling the pixel isolation part 324 and the concavo-convex structure 325 in the same processing.

An airgap 333 is formed in the interior of the filler member 332 embedded in the pixel isolation part 324. The airgap 333 is arranged in the interior of the pixel isolation part 324 on both of the cross-sectional plane (dashed line B) corresponding to the cross portion of the concavo-convex structure 325 and the cross-sectional plane (dashed line C) corresponding to the line portion thereof. On the other hand, as described above, the airgap 331 arranged in the concavo-convex structure 325 is formed on the cross-sectional plane (dashed line B) corresponding to the cross portion of the concavo-convex structure 325, and is not formed on the cross-sectional plane (dashed line C) corresponding to the line portion thereof. This is because the pixel isolation part 324 formed as an isolation structure for preventing light from leaking to the adjacent pixel 101 has a line width wider than that of the concavo-convex structure 325, and the airgap 333 is easily formed in the pixel isolation part 324. In other words, a width of the pixel isolation part 324 in a third direction as an in-plane direction of the first plane is wider than a width of a trench portion for forming the concavo-convex structure 325 in the third direction. Because light transmissivity of the airgap is lower than that of the filler member 332, an effect of preventing leakage of light to the adjacent pixel 101 is improved by forming the airgap in the interior of the isolation structure.

Further, an upper end of the airgap 333 (an end portion on a side of the first plane) is located at a position deeper than a position of an upper end of the airgap 331 from the light incident plane, and a lower end of the airgap 333 (an end portion on a side of the second plane) is located at a position deeper than a position of a lower end of the airgap 331 from the light incident plane. In other words, a shortest distance from the first plane (light incident plane) to the end portion of the airgap 333 on a side of the second plane (i.e., plane opposite to the light incident plane), arranged in the interior of the pixel isolation part 324, is greater than a shortest distance from the light incident plane to the end portion of the airgap 331 on a side of the plane opposite to the light incident plane, arranged in the interior of the concavo-convex structure 325. As described above, because the pixel isolation part 324 has a wider line width, a larger amount of filler members 332 are necessary in order to fill the interior of the trench portion. By filling the interior of the trench portion in a state where the airgap 333 is formed in a lower part thereof, the interior of the trench portion can be closed with a small amount of filler members 332.

In addition, the airgaps 331 and 333 can be formed at optional positions depending on a trench pattern, a tapered shape of the trench portion, and a filling method of the filler member 332.

A photoelectric conversion apparatus 100 according to a second exemplary embodiment will be described with reference to FIG. 11.

Descriptions common to the first exemplary embodiment are omitted, and a configuration different from that of the first exemplary embodiment is mainly described. In the present exemplary embodiment, the airgap 331 is also formed in the line portion of the concavo-convex structure 325.

Figure 11:
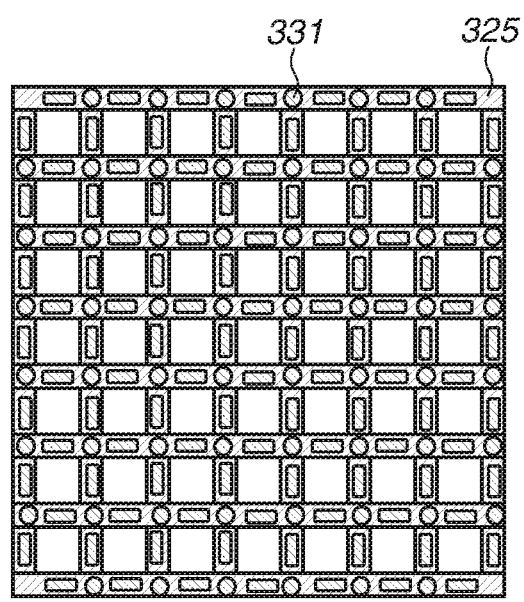
FIG. 11 is a schematic diagram of a photoelectric conversion apparatus according to a second exemplary embodiment.

FIG. 11 is a plan view of the concavo-convex structure 325 arranged on one pixel 101 of the photoelectric conversion apparatus 100 according to the present exemplary embodiment, which illustrates plan positions of airgaps 331 formed in the concavo-convex structure 325 arranged in a grid-like state.

In the present exemplary embodiment, the airgaps 331 are arranged not only in the cross portions but also in the line portions. A filler member 332 is arranged in a region between the airgap 331 arranged in the cross portion and the airgap 331 arranged in the line portion, so that the airgap 331 in the cross portion and the airgap 331 in the line portion are not formed continuously. By forming the airgap 331 in the cross portion and the airgap 331 in the line portion discontinuously, a degree of diffraction is increased because of a difference between refractive indexes of the airgap 331 and the filler member 332, so that an effect of improving the sensitivity to near-infrared light can be acquired.

A photoelectric conversion apparatus 100 according to a third exemplary embodiment will be described with reference to FIG. 12.

Descriptions common to the first exemplary embodiment are omitted, and a configuration different from that of the first exemplary embodiment is mainly described. In the present exemplary embodiment, the airgaps 331 are formed in part of the line portions of the concavo-convex structure 325.

Figure 12:
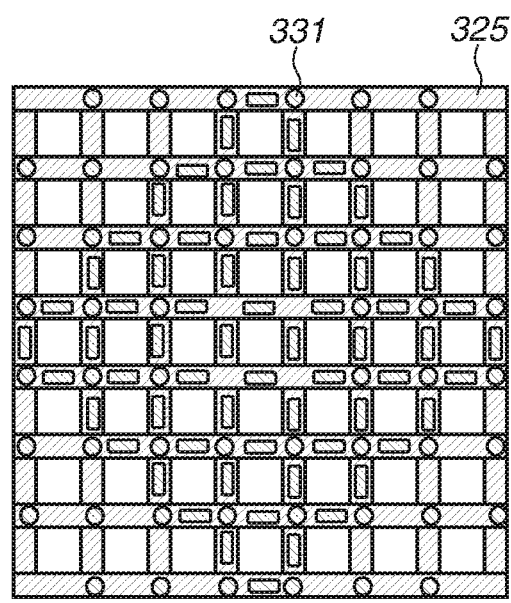
FIG. 12 is a schematic diagram of a photoelectric conversion apparatus according to a third exemplary embodiment.

FIG. 12 is a plan view of the concavo-convex structure 325 arranged on one pixel 101 of the photoelectric conversion apparatus 100 according to the present exemplary embodiment, which illustrates plan positions of airgaps 331 formed in the concavo-convex structure 325 arranged in a grid-like state. The airgaps 331 are formed in the cross portions and part of the line portions of the concavo-convex structure 325. The airgaps 331 are formed in the line portions located in a region close to the central part of the pixel 101 on which a large amount of light is incident.

By increasing a line width of a trench portion for forming the concavo-convex structure 325, an interior of the trench portion is slowly closed with the filler member 332, so that an airgap 331 is generated. Therefore, the airgap 331 can be formed in a desired position by making a line width of the trench portion where the airgap 331 is to be created wider than a line width of the trench portion where the airgap 331 is not created. For example, by making a line width of the trench portion where the airgap 331 is to be created $\sqrt{2}$ times as large as a line width of the trench portion where the airgap 331 is not created, the airgap 331 similar to the one formed in the cross portion can be formed. As described above, by controlling the arrangement of airgaps 331 formed in the concavo-convex structure 325, it is possible to control the sensitivity and the optical color mixture depending on the properties of the photoelectric conversion apparatus 100.

Figure 13:
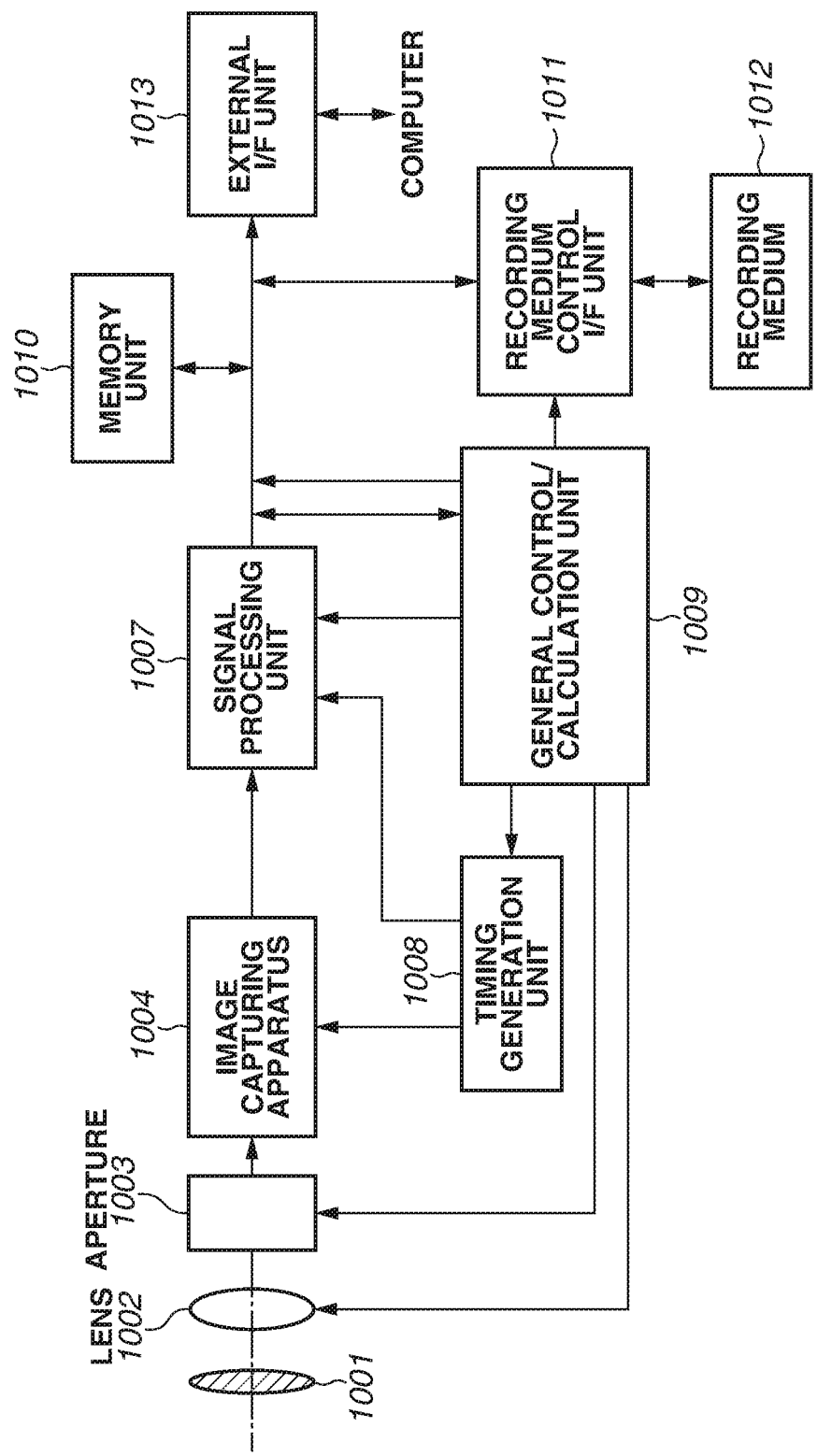
FIG. 13 is a functional block diagram of a photoelectric conversion system according to a fourth exemplary embodiment.

A photoelectric conversion system according to a fourth exemplary embodiment will be described with reference to FIG. 13. FIG. 13 is a block diagram illustrating a schematic configuration of the photoelectric conversion system according to the present exemplary embodiment.

The photoelectric conversion apparatus 100 described in the first to the sixth exemplary embodiments can be applied to various photoelectric conversion systems. A digital still camera, a digital camcorder, a monitoring camera, a copying machine, a facsimile machine, a mobile phone, an in-vehicle camera, and an observation satellite are given as the examples of the applicable photoelectric conversion system. Further, a camera module which includes an optical system such as a lens and an image capturing apparatus is also included in the photoelectric conversion system. FIG. 13 illustrates a block diagram of a digital still camera as one example.

The photoelectric conversion system illustrated in FIG. 13 includes an image capturing apparatus 1004 as one example of the photoelectric conversion apparatus 100 and a lens 1002 which forms an optical image of an object on the image capturing apparatus 1004. The photoelectric conversion system further includes an aperture 1003 capable of changing an amount of light passing through the lens 1002 and a barrier 1001 for protecting the lens 1002. The lens 1002 and the aperture 1003 function as an optical system which condenses light to the image capturing apparatus 1004. The image capturing apparatus 1004 is the photoelectric conversion apparatus 100 according to any one of the above-described exemplary embodiments, and the image capturing apparatus 1004 converts an optical image formed by the lens 1002 into an electric signal.

The photoelectric conversion system further includes a signal processing unit or circuit 1007 which serves as an image generation unit to generate an image by executing processing on a signal output from the image capturing apparatus 1004. The signal processing unit 1007 executes various types of correction and compression as necessary, and outputs image data. The signal processing unit 1007 may be formed on a semiconductor substrate on which the image capturing apparatus 1004 is mounted, or may be formed on a semiconductor substrate different from the semiconductor substrate where the image capturing apparatus 1004 is mounted.

The photoelectric conversion system further includes a memory unit 1010 for temporarily storing image data and an external interface (I/F) unit 1013 for communicating with an external computer. Furthermore, the photoelectric conversion system includes a recording medium 1012 such as a semiconductor memory for recording and reading captured image data and a recording medium control interface (I/F) unit or circuit 1011 for recording captured image data in the recording medium 1012 and reading captured image data from the recording medium 1012. In addition, the recording medium 1012 may be built into the photoelectric conversion system, or may be attachable to and detachable from the photoelectric conversion system.

Further, the photoelectric conversion system includes a general control/calculation unit or circuit 1009 which executes various types of calculation and control of the entire digital still camera, and a timing generation unit or circuit 1008 which outputs various timing signals to the image capturing apparatus 1004 and the signal processing unit 1007. Herein, a timing signal may be input thereto from the outside. Therefore, the photoelectric conversion system may include at least the image capturing apparatus 1004 and the signal processing unit 1007 for executing processing on a signal output from the image capturing apparatus 1004.

The image capturing apparatus 1004 outputs an imaging signal to the signal processing unit 1007. The signal processing unit 1007 executes predetermined signal processing on the imaging signal output from the image capturing apparatus 1004, and outputs image data. The signal processing unit 1007 generates an image by using the imaging signal.

As described above, according to the present exemplary embodiment, it is possible to realize a photoelectric conversion system to which the photoelectric conversion apparatus 100 (image capturing apparatus) according to any one of the above-described exemplary embodiments is applied.

Figure 14A:
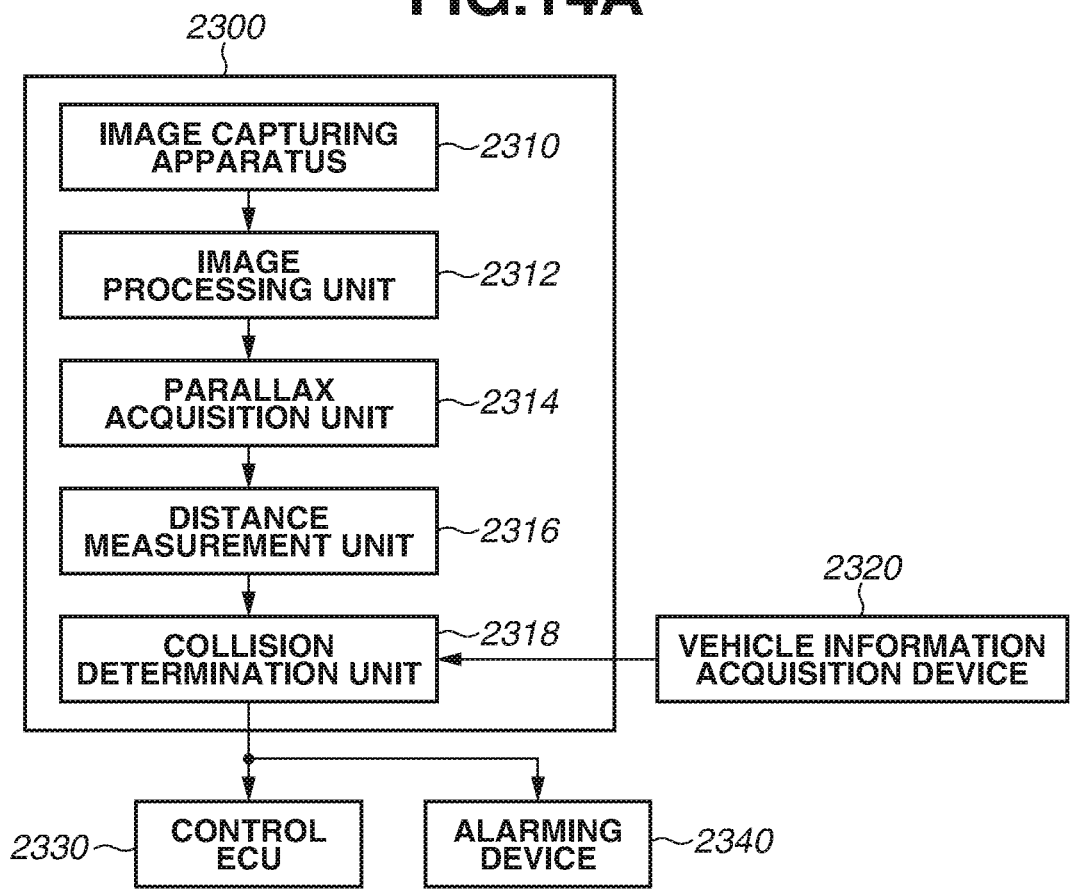
FIGS. 14A and 14B are functional block diagrams of a photoelectric conversion system according to a fifth exemplary embodiment.
Figure 14B:
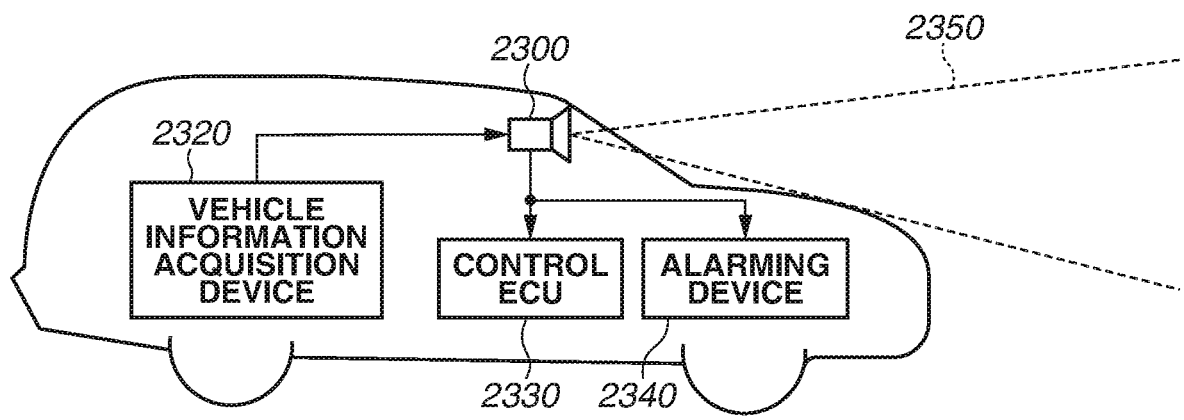

A photoelectric conversion system and a moving body according to a fifth exemplary embodiment will be described with reference to FIGS. 14A and 14B. FIGS. 14A and 14B are diagrams illustrating configurations of the photoelectric conversion system and the moving body according to the present exemplary embodiment.

FIG. 14A illustrates an example of the photoelectric conversion system applied to an in-vehicle camera. A photoelectric conversion system 2300 includes an image capturing apparatus 2310. The image capturing apparatus 2310 is the photoelectric conversion apparatus 100 according to any one of the above-described exemplary embodiments. The photoelectric conversion system 2300 includes an image processing unit or circuit 2312 for executing image processing on a plurality of pieces of image data acquired by the image capturing apparatus 2310 and a parallax acquisition unit or circuit 2314 for calculating a parallax (i.e., a phase difference between parallax images) from a plurality of pieces of image data acquired by the photoelectric conversion system 2300. The photoelectric conversion system 2300 further includes a distance acquisition unit or circuit (distance measurement unit) 2316 for calculating a distance to a target object based on the calculated parallax, and a collision determination unit or circuit 2318 for determining a possibility of collision based on the calculated distance. Herein, the parallax acquisition unit 2314 and the distance acquisition unit 2316 are examples of a distance information acquisition unit which acquires distance information about a distance to a target object. In other words, the distance information refers to information about a parallax, a defocus amount, and a distance to a target object. The collision determination unit 2318 may determine a possibility of collision by using any one of the pieces of distance information. The distance information acquisition unit may be configured of hardware exclusively designed, or may be configured of a software module.

Further, the distance information acquisition unit may be configured of a field programmable gate array (FPGA) or an application specific integrated circuit (ASIC), or may be configured of a combination of these elements.

The photoelectric conversion system 2300 is connected to a vehicle information acquisition device 2320, and can acquire vehicle information such as a vehicle speed, a yaw rate, and a rudder angle. Further, the photoelectric conversion system 2300 is connected to a control ECU (ECU: electronic control unit) 2330. The control ECU 2330 is a control unit which outputs a control signal for generating braking power to the vehicle based on a determination result acquired by the collision determination unit 2318. The photoelectric conversion system 2300 is also connected to an alarming device 2340 which issues a warning to a driver based on a determination result acquired by the collision determination unit 2318. For example, in a case where the collision determination unit 2318 determines that a possibility of collision is high, the control ECU 2330 executes vehicle control to avoid a collision or to reduce damages by applying a brake, releasing a gas pedal, or suppressing an engine output. The alarming device 2340 issues a warning to the driver by making alarm sound, displaying alarming information on a display screen of a car navigation system, or producing vibrations in a seat belt or steering wheels.

In the present exemplary embodiment, peripheral views of the vehicle, e.g., a forward view and a backward view of the vehicle are captured by the photoelectric conversion system 2300. FIG. 14B illustrates a state where a forward view (image capturing range 2350) of the vehicle is captured by the photoelectric conversion system 2300. The vehicle information acquisition device 2320 issues an instruction to the photoelectric conversion system 2300 or the image capturing apparatus 2310. Through the above-described configuration, it is possible to further improve the range finding accuracy.

In the above-described exemplary embodiment, although control processing for preventing the vehicle from colliding with another vehicle has been described as an example, the disclosure can also be applied to control processing which enables the vehicle to be automatically driven while following another vehicle or control processing which enables the vehicle to be automatically driven without being drifted out of a traffic lane. Further, the photoelectric conversion system 2300 can be applied not only to vehicles such as automobiles but also to moving bodies (moving apparatuses) such as a ship, an airplane, and an industrial robot. In addition, the photoelectric conversion system 2300 can be applied not only to the moving bodies but also to a device such as an intelligent transportation system (ITS) which widely employs an object recognition function.

Figure 15:
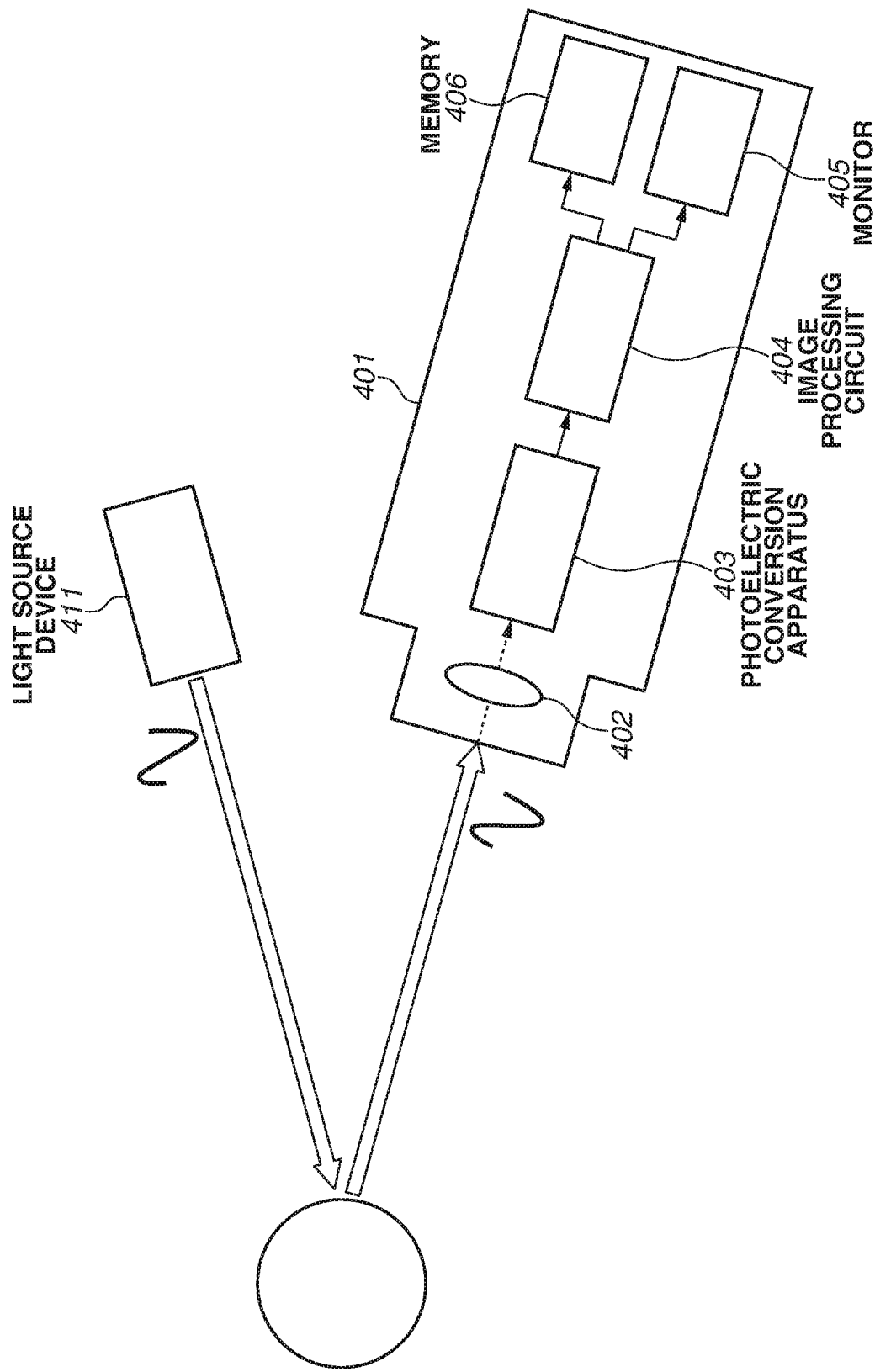
FIG. 15 is a functional block diagram of a photoelectric conversion system according to a sixth exemplary embodiment.

A photoelectric conversion system according to a sixth exemplary embodiment will be described with reference to FIG. 15. FIG. 15 is a block diagram illustrating a configuration example of a distance image sensor as an example of the photoelectric conversion system according to the present exemplary embodiment.

As illustrated in FIG. 15, a distance image sensor 401 includes an optical system 402, a photoelectric conversion apparatus 403, an image processing circuit 404, a monitor 405, and a memory 406. The distance image sensor 401 can acquire a distance image according to a distance to an object by receiving light emitted from a light source device 411 to the object and reflected on a surface of the object (i.e., modulated light or pulsed light).

The optical system 402 is configured of one or a plurality of lenses. The optical system 402 introduces image light (incident light) from an object to the photoelectric conversion apparatus 403, and forms an image on a light receiving plane (sensor part) of the photoelectric conversion apparatus 403.

The photoelectric conversion apparatus 100 according to the above-described exemplary embodiment is applied to the photoelectric conversion apparatus 403, and a distance signal indicating a distance, which can be acquired from a light receiving signal output from the photoelectric conversion apparatus 403, is supplied to the image processing circuit 404.

Based on the distance signal supplied from the photoelectric conversion apparatus 403, the image processing circuit 404 executes image processing to create a distance image. The distance image (image data) acquired from the image processing is supplied to and displayed on the monitor 405, or supplied to and stored (recorded) in the memory 406.

According to the distance image sensor 401 configured as the above, properties of the pixels are improved by applying the above-described photoelectric conversion apparatus 100. Therefore, for example, it is possible to acquire a distance image more accurately.

Figure 16:
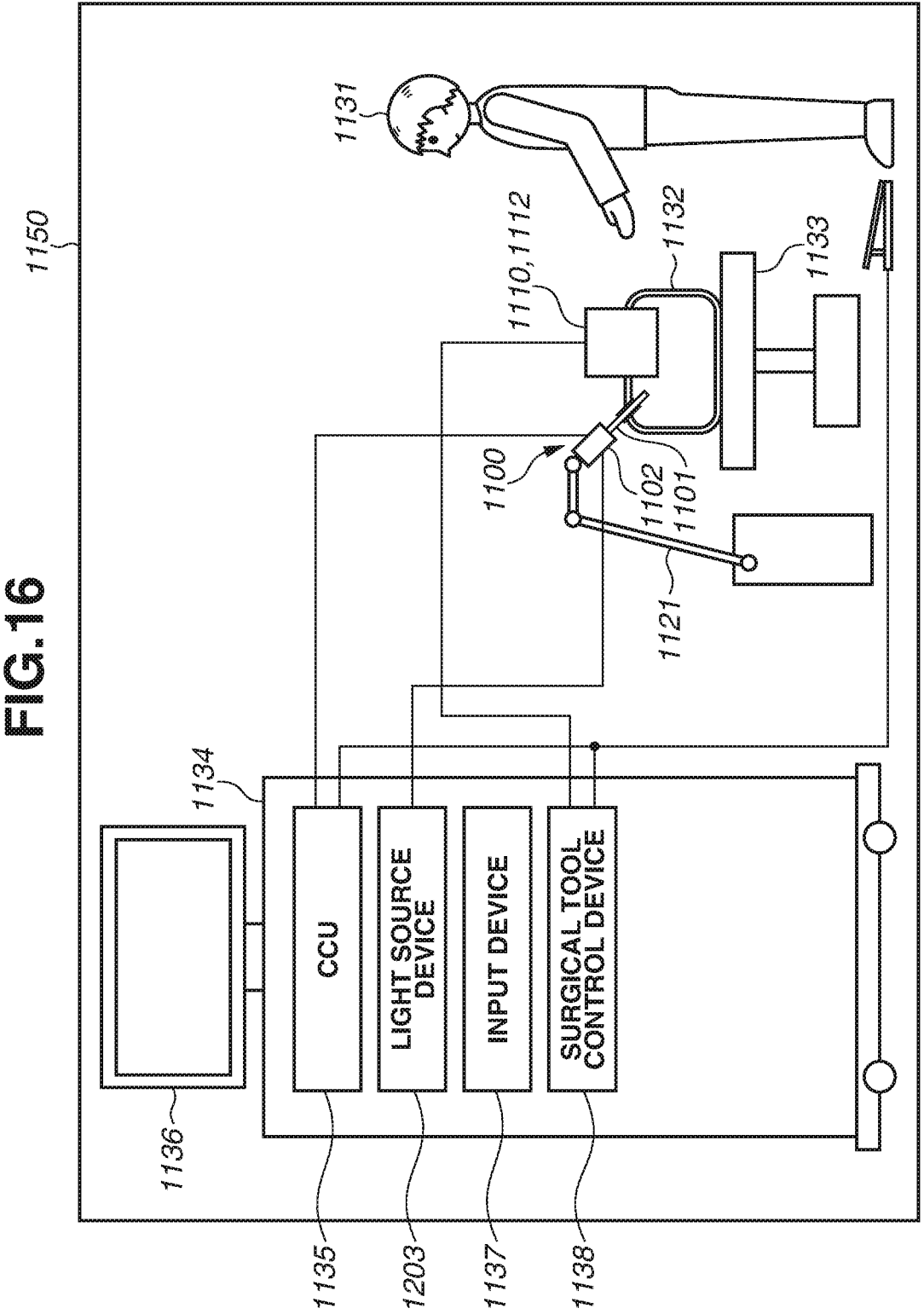
FIG. 16 is a functional block diagram of a photoelectric conversion system according to a seventh exemplary embodiment.

A photoelectric conversion system according to a seventh exemplary embodiment will be described with reference to FIG. 16. FIG. 16 is a diagram illustrating an example of a schematic configuration of an endoscopic operation system as an example of a photoelectric conversion system according to the present exemplary embodiment.

FIG. 16 illustrates a state where an operator (doctor) 1131 performs an operation on a patient 1132 lying on a patient bed 1133 by using an endoscopic operation system 1150. As illustrated in FIG. 16, the endoscopic operation system 1150 is configured of an endoscope 1100, a surgical tool 1110, and a cart 1134 on which various devices for executing the endoscopic operation are mounted.

The endoscope 1100 is configured of a lens tube 1101 and a camera head 1102 connected to a base end section of the lens tube 1101, and a leading end portion of the lens tube 1101 having a predetermined length is inserted to a coelom of the patient 1132. In FIG. 16, the endoscope 1100 is illustrated as a so-called rigid endoscope having the rigid lens tube 1101. However, the endoscope 1100 can be a so-called flexible endoscope having a flexible lens tube.

A leading end of the lens tube 1101 includes an opening portion on which an objective lens is mounted. A light source device 1203 is connected to the endoscope 1100, so that light generated by the light source device 1203 is introduced to the leading end of the lens tube 1101 by a light guide arranged to extend through the inner portion of the lens tube 1101 and emitted to an observation target inside the coelom of the patient 1132 via the objective lens. In addition, the endoscope 1100 can be a forward viewing endoscope, an oblique viewing endoscope, or a side viewing endoscope.

An optical system and a photoelectric conversion apparatus are arranged in the interior of the camera head 1102, and reflection light (observation light) reflected from the observation target is condensed to the photoelectric conversion apparatus through the optical system. The photoelectric conversion apparatus executes photoelectric conversion on the observation light and generates an electric signal corresponding to the observation light, i.e., an image signal corresponding to an observation image. The photoelectric conversion apparatus 100 according to the above-described exemplary embodiment can be used as the photoelectric conversion apparatus. The image signal is transmitted to a camera control unit (CCU) or circuit 1135 in a form of RAW data.

The CCU 1135 is configured of a central processing unit (CPU) and a graphics processing unit (GPU), and comprehensively controls the operation of the endoscope 1100 and a display device 1136. Further, the CCU 1135 receives an image signal from the camera head 1102 and executes various types of image processing such as development processing (de-mosaic processing) on the image signal in order to display an image based on the image signal.

The display device 1136 is controlled by the CCU 1135 to display an image based on the image signal on which the image processing is executed by the CCU 1135.

For example, the light source device 1203 is configured of a light source such as a light emitting diode (LED), and supplies irradiation light to the endoscope 1100 when an operative field image is to be captured.

An input device 1137 is an input interface of the endoscopic operation system 1150. A user can input various types of information and instructions to the endoscopic operation system 1150 via the input device 1137.

A surgical tool control device 1138 executes driving control of an energy surgical tool 1112 used for cauterizing and incising living tissues or sealing a blood vessel.

For example, the light source device 1203 can be configured of an LED, a laser light source, or a white light source configured of a combination of these elements, and supplies irradiation light to the endoscope 1100 when an operative field image is to be captured. In a case where the white light source is configured of a combination of RGB laser light sources, output intensities and output timings of respective colors (wavelengths) can be controlled with high accuracy. Therefore, a white balance of the captured image can be adjusted by the light source device 1203. Further, in this case, the observation target is irradiated with laser light beams emitted from the RGB laser light sources in a time division manner, and image sensors of the camera head 1102 are controlled and driven in synchronization with the irradiation timing. In this way, images corresponding to respective RGB laser beams can be captured in the time division manner. Through the above-described method, it is possible to acquire color images without arranging color filters on the image sensors.

Further, the light source device 1203 may be controlled and driven in order to change intensity of output light at every specified time. By acquiring and combining images in a time division manner by executing driving control of the image sensors of the camera head 1102 in synchronization with the timing of changing light intensity, the endoscopic operation system 1150 can generate so-called wide dynamic range image data without including underexposed or overexposed data.

The light source device 1203 may be configured to supply light of a predetermined wavelength band for special light observation. For example, the special light observation is executed by making use of wavelength dependence of light absorption of the living tissues. Specifically, specific tissues such as blood vessels on a mucous membrane surface are captured with high contrast by irradiating the tissues with light having a wavelength band narrower than a wavelength band of irradiation light (i.e., white light) used for normal observation.

Alternatively, the special light observation such as fluorescence observation for acquiring an image by generating fluorescence in living tissues by irradiating the living tissues with excitation light may be executed. In the fluorescence observation, fluorescence generated from living tissues can be observed by irradiating the living tissues with excitation light. Further, a fluorescent image can also be acquired by locally injecting test reagent such as indocyanine green (ICG) into living tissues and irradiating the living tissues with excitation light corresponding to a fluorescence wavelength of that test reagent. The light source device 1203 may be configured to supply narrow-band light and/or excitation light for the above-described special light observation.

Figure 17A:
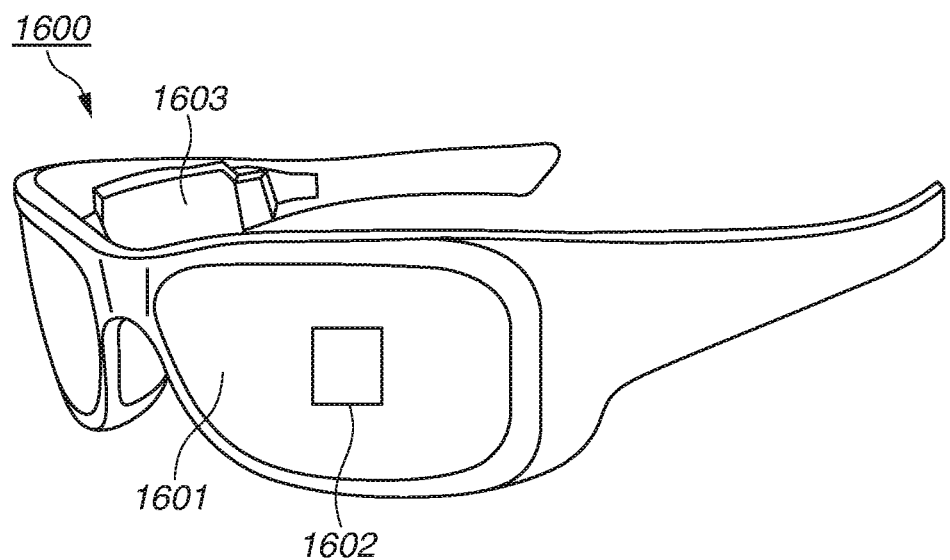
FIGS. 17 and 17B are functional block diagrams of a photoelectric conversion system according to an eighth exemplary embodiment.

A photoelectric conversion system according to an eighth exemplary embodiment will be described with reference to FIGS. 17A and 17B. FIG. 17A is a diagram illustrating a pair of eyeglasses 1600 (a pair of smart-glasses) as an example of the photoelectric conversion system according to the present exemplary embodiment. The pair of eyeglasses 1600 includes a photoelectric conversion apparatus 1602. The photoelectric conversion apparatus 1602 is the photoelectric conversion apparatus 100 according to the above-described exemplary embodiment. Further, a display device including a light emitting device such as an organic light emitting diode (OLED) or an LED may be mounted on a rear face of each of lenses 1601. One or more photoelectric conversion apparatus 1602 may be mounted thereon. Further, a plurality of types of photoelectric conversion apparatuses may be used in combination. A mounting position of the photoelectric conversion apparatus 1602 is not limited to the position illustrated in FIG. 17A.

The pair of eyeglasses 1600 further includes a control device 1603. The control device 1603 functions as a power source for supplying power to the photoelectric conversion apparatus 1602 and the above-described display device. The control device 1603 further controls the operations of the photoelectric conversion apparatus 1602 and the display device. An optical system which condenses light to the photoelectric conversion apparatus 1602 is formed on the lens 1601.

Figure 17B:
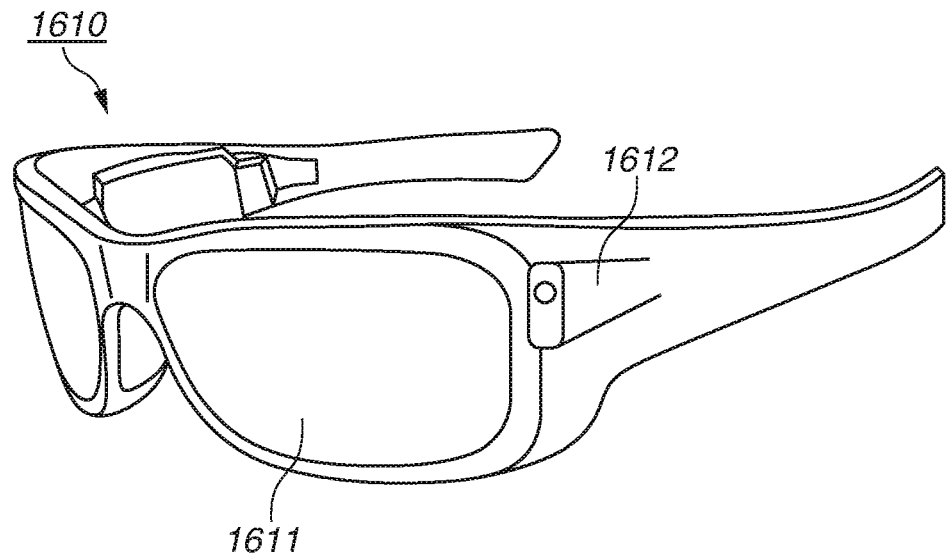

FIG. 17B illustrates a pair of eyeglasses 1610 (a pair of smart-glasses) according to one application example. The pair of eyeglasses 1610 includes a control device 1612, and a photoelectric conversion apparatus corresponding to the photoelectric conversion apparatus 1602 and a display device are mounted on the control device 1612. An optical system for projecting light emitted from the photoelectric conversion apparatus and the display device included in the control device 1612 is formed on each of lenses 1611, so that images are projected thereon. The control device 1612 functions as a power source for supplying power to the photoelectric conversion apparatus and the display device, and also controls the operation of the photoelectric conversion apparatus and the display device. The control device 1612 may include a line-of-sight detection unit for detecting a line-of-sight of the user. Infrared light may be used for detecting the line-of-sight. An infrared light emitting unit emits infrared light to the eyeball of the user who is gazing at a display image. An image capturing unit having a light receiving element detects the emitted infrared light reflected on the eyeball, so that captured image of the eyeball can be acquired. It is possible to suppress lowering of image quality by arranging a reduction unit which reduces light emitted to the display portion from the infrared light emitting unit in a planar view.

The line-of-sight of the user gazing at the display image can be detected from the captured image of the eyeball acquired from image capturing using infrared light. An optional known method can be employed for line-of-sight detection using the captured image of the eyeball. For example, it is possible to employ a method of detecting a line-of-sight based on a Purkinje image acquired from irradiation light reflected on the cornea.

More specifically, line-of-sight detection processing using a pupil-corneal reflection method is executed. In the pupil-corneal reflection method, a line-of-sight vector which expresses the orientation (rotation angle) of the eyeball is calculated based on a pupil image and a Purkinje image included in the captured image of the eyeball, and a user's line-of-sight is detected from the calculated line-of-sight vector.

The display device according to the present exemplary embodiment may include a photoelectric conversion apparatus having a light receiving element, and a display image displayed on the display device may be controlled based on the user's line-of-sight information received from the photoelectric conversion apparatus.

Specifically, based on the line-of-sight information, the display device determines a first field-of-view region where the user is gazing at and a second field-of-view region different from the first field-of-view region. The first and second field-of-view regions may be determined by the control device of the display device, or the display device may receive the first and the second field-of-view regions determined by an external control device. In the display area of the display device, a display resolution of the first field-of-view region may be controlled to be higher than that of the second field-of-view region. In other words, the second field-of-view region may be displayed in a resolution lower than that of the first field-of-view region.

Further, the display area may have a first display area and a second display area different from the first display area, and an area of higher priority may be determined from the first and the second display areas based on the line-of-sight information. The first and the second display areas may be determined by the control device of the display device, or the display device may receive the first and the second display areas determined by an external control device. The resolution of the area of higher priority may be controlled to be higher than the resolution of the area different from the area of higher priority. In other words, resolution of the area of relatively low priority may be reduced.

In addition, an artificial intelligence (AI) program may be used for determining the first field-of-view region and the area of higher priority. The AI program may be a model configured to estimate an angle of the line-of-sight and a distance to an object to which the line-of-sight is directed from an image of the eyeball by using an image of the eyeball and the actual line-of-sight direction of the eyeball in the image as training data. The AI program may be included in the display device, the photoelectric conversion apparatus, or an external device. In a case where the AI program is included in the external device, information is transmitted to the display device through communication.

In a case where display control is executed based on line-of-sight detection, the present exemplary embodiment can favorably be applied to a pair of smart-glasses which further includes a photoelectric conversion apparatus for capturing an outside view. The pair of smart-glasses can display information about the captured outside view in real time.

<Variation of Exemplary Embodiments>

The disclosure is not limited to the above-described exemplary embodiments, and various changes and modifications are possible.

For example, an exemplary embodiment in which part of the configurations according to any one of the above-described exemplary embodiments is added to another exemplary embodiment or replaced with part of the configurations according to another exemplary embodiment is also included in the exemplary embodiments.

Further, the photoelectric conversion systems described in the fourth and fifth exemplary embodiments are merely examples of the photoelectric conversion system to which the photoelectric conversion apparatus can be applied, and a configuration of the photoelectric conversion system, to which the photoelectric conversion apparatus according to the disclosure can be applied, is not limited to the configurations illustrated in FIGS. 13, 14A, and 14B. The same can also be said for the TOF system described in the sixth exemplary embodiment, the endoscopic operation system described in the seventh exemplary embodiment, and the pair of smart-glasses described in the eighth exemplary embodiment.

In addition, the above-described exemplary embodiments are merely the examples embodying the disclosure, and shall not be construed as limiting the technical range of the disclosure. In other words, the disclosure can be realized in diverse ways without departing from the technical spirit or main features of the disclosure.

According to an aspect of the embodiments, it is possible to provide a photoelectric conversion system capable of reducing optical color mixture of a photoelectric conversion apparatus.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-040248, filed Mar. 15, 2022, which is hereby incorporated by reference herein in its entirety.

What is claimed is:

1. A photoelectric conversion apparatus comprising:
a plurality of photoelectric conversion circuits configured to be arranged in a semiconductor layer having a first plane and a second plane opposite to the first plane,
wherein the plurality of photoelectric conversion circuits are individually isolated by an isolation structure,
wherein the semiconductor layer includes a plurality of trench portions arranged on the first plane,
wherein the plurality of trench portions are configured of a first trench portion extending in a first direction as an in-plane direction of the first plane and a second trench portion extending in a second direction as an in-plane direction of the first plane intersecting with the first direction,
wherein a filler member and an airgap are arranged in an interior of a trench portion at a position where the first trench portion and the second trench portion intersect with each other, and in an interior of the isolation structure, and
wherein a shortest distance from the first plane to an end portion of the airgap on a side of the second plane, arranged in the interior of the isolation structure, is greater than a shortest distance from the first plane to an end portion of the airgap on the side of the second plane, arranged in the interior of the trench portion.

2. The photoelectric conversion apparatus according to claim 1, wherein a width of the isolation structure in a third direction as an in-plane direction of the first plane is larger than a width of the trench portion in the third direction.

3. The photoelectric conversion apparatus according to claim 1, wherein the filler member is arranged in a region between an end portion of the trench portion on a side of the second plane and an end portion of the airgap on the side of the second plane arranged in the interior of the trench portion.

4. The photoelectric conversion apparatus according to claim 1, wherein an end portion of the airgap on a side of the first plane arranged in the interior of the trench portion conforms to the first plane.

5. The photoelectric conversion apparatus according to claim 1, wherein the trench portion has a trench structure.

6. The photoelectric conversion apparatus according to claim 1, wherein the filler member is an oxide film or a nitride film.

7. A photoelectric conversion system including the photoelectric conversion apparatus according to claim 1, comprising:
a light emitting circuit configured to emit light detected by the photoelectric conversion apparatus; and
a calculation circuit configured to calculate a distance by using a digital signal retained by the photoelectric conversion apparatus.

8. A moving body comprising:
the photoelectric conversion apparatus according to claim 1;
a distance information acquisition circuit configured to acquire distance information about a distance to a target object from a parallax image based on a signal from the photoelectric conversion apparatus; and
a control circuit configured to control the moving body based on the distance information.

9. A photoelectric conversion comprising:
a plurality of photoelectric conversion circuits configured to be arranged in a semiconductor layer having a first plane and a second plane opposite to the first plane,
wherein the plurality of photoelectric conversion circuits are individually isolated by an isolation structure,
wherein the semiconductor layer includes a plurality of trench portions arranged on the first plane,
wherein the plurality of trench portions are configured of a first trench portion extending in a first direction as an in-plane direction of the first plane and a second trench portion extending in a second direction as an in-plane direction of the first plane intersecting with the first direction, wherein a filler member and an airgap are arranged, in an interior of a trench portion at a position where the first trench portion and the second trench portion intersect with each other, and in an interior of the isolation structure, and wherein a length of the airgap from one end portion on a side of the first plane to another end portion on a side of the second plane, arranged in the interior of the trench portion, is shorter than a length of the airgap from one end portion on the side of the first plane to another end portion on the side of the second plane, arranged in the interior of the isolation structure.

10. The photoelectric conversion apparatus according to claim 9, wherein a width of the isolation structure in a third direction as an in-plane direction of the first plane is larger than a width of the trench portion in the third direction.

11. The photoelectric conversion apparatus according to claim 9, wherein an end portion of the airgap on a side of the first plane arranged in the interior of the trench portion conforms to the first plane.

12. A photoelectric conversion system including the photoelectric conversion apparatus according to claim 9, comprising:
a light emitting circuit configured to emit light detected by the photoelectric conversion apparatus; and
a calculation circuit configured to calculate a distance by using a digital signal retained by the photoelectric conversion apparatus.

13. A moving body comprising:
the photoelectric conversion apparatus according to claim 9;
a distance information acquisition circuit configured to acquire distance information about a distance to a target object from a parallax image based on a signal from the photoelectric conversion apparatus; and
a control circuit configured to control the moving body based on the distance information.

14. A photoelectric conversion apparatus comprising:
a plurality of photoelectric conversion circuits configured to be arranged in a semiconductor layer having a first plane and a second plane opposite to the first plane,
wherein the plurality of photoelectric conversion circuits are individually isolated by an isolation structure,
wherein the semiconductor layer includes a plurality of trench portions arranged on the first plane,
wherein the plurality of trench portions are configured of a first trench portion extending in a first direction as an in-plane direction of the first plane and a second trench portion extending in a second direction as an in-plane direction of the first plane intersecting with the first direction,
wherein a filler member and an airgap are arranged, in an interior of a trench portion at a position where the first trench portion and the second trench portion intersect with each other, and in an interior of the isolation structure, and
wherein a region between the airgap arranged at the position where the first trench portion and the second trench portion intersect with each other and the airgap arranged in the first trench portion is filled with the filler member.

* * * * *